(12) United States Patent
Katsuyama et al.

(10) Patent No.: US 7,356,063 B2
(45) Date of Patent: Apr. 8, 2008

(54) SEMICONDUCTOR SURFACE EMITTING DEVICE

(75) Inventors: Tsukuru Katsuyama, Yokohama (JP); Jun-ichi Hashimoto, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 552 days.

(21) Appl. No.: 10/822,142

(22) Filed: Apr. 12, 2004

(65) Prior Publication Data
US 2005/0135450 A1    Jun. 23, 2005

(30) Foreign Application Priority Data
Jul. 30, 2003    (JP)    ............... P2003-283055

(51) Int. Cl.
*H01S 5/00*    (2006.01)
(52) U.S. Cl. .............. 372/50.124; 372/43.01; 372/45.01
(58) Field of Classification Search ............ 372/43.01, 372/45.01
See application file for complete search history.

(56) References Cited
U.S. PATENT DOCUMENTS
7,180,100 B2 *    2/2007    Takahashi et al. .......... 257/101

OTHER PUBLICATIONS

Kenichi Iga, et al., "Basis and Application of Surface Emitting Lasers" pp. 30-31 with English-language translation, available prior to U.S. filing.
Kenichi Iga, "Surface Emitting Lasers", Electronics and Communications in Japan, Part 2, vol. 82, No. 10, 1999, pp. 70-82.

* cited by examiner

*Primary Examiner*—Dung T. Nguyen
(74) *Attorney, Agent, or Firm*—Smith, Gambrell & Russell, LLP

(57) ABSTRACT

This surface emitting semiconductor device 1 comprises a first conductivity type semiconductor region, an active layer, a second conductivity type semiconductor layer and current block semiconductor region. The first conductivity type semiconductor region is provided on a surface made of GaAs semiconductor. The active layer is provided on the first conductivity type semiconductor region. The active layer has a side surface. The second conductivity type semiconductor layer is provided on the active layer. The second conductivity type semiconductor layer has a side surface. The current block semiconductor region is provided on the side surface of the active layer and on the side surface of the second conductivity type semiconductor layer. The active layer is made of III-V compound semiconductor including at least nitrogen element as a V group element.

17 Claims, 11 Drawing Sheets

SEMICONDUCTOR SURFACE EMITTING DEVICE

BACKGROUND OF THE INVENTION

1. Field of the Invention

The present invention relates to a surface emitting semiconductor device.

2. Related Background of the Invention

There are a number of types of current confinement structures for surface emitting lasers, such as vertical cavity surface emitting lasers (VCSELs). Publication ("Basis and Application of Surface Emitting Lasers", Kenji Iga, Fumio Ogawa, Kyouritsu Publication, pp. 30-31) discloses five types of current confinement structures as follows: (1) ring electrode type; (2) proton implantation type; (3) buried heterostructure type; (4) air post type; and (5) selective oxidation type. Most of VCSELs use types (2) and (5).

SUMMARY OF THE INVENTION

In order to form a surface emitting laser of type (2), proton ions are implanted into a semiconductor region to modify it into an insulating region. The insulating region acts to confine current flowing through the surface emitting laser. The surface emitting laser of this type is not sufficient to confine the current. Further, the insulative property of the implanted region may be degraded by a heating step in a manufacturing process provided after forming the insulating region.

In order to form a surface emitting laser of type (5), an AlAs semiconductor layer is grown and then the periphery of the AlAs semiconductor layer is selectively oxidized to form a insulating region of $Al_2O_3$, and the center of the AlAs semiconductor layer remains unchanged so as to form an aperture of AlAs semiconductor. The current flows through this aperture. The oxidation region acts to confine current flowing through the surface emitting lasers. It is not easy to control the size of the aperture using the oxidation because the AlAs semiconductor layer is oxidized from its outer portion to its inner portion. Further, since the AlAs semiconductor layer is selectively oxidized after forming it, epitaxial semiconductor layers provided on both sides of the AlAs semiconductor layer may be peeled.

Therefore, it is an object of the present invention to provide a surface emitting semiconductor device which can confines the current well.

According to one aspect of the present invention, a surface emitting semiconductor device comprises a first conductivity type semiconductor region, a semiconductor mesa, a current block semiconductor region, a first DBR portion, and a second DBR portion. The first conductivity type semiconductor region is provided on a GaAs semiconductor region and includes a primary surface having a first area and a second area. The semiconductor mesa includes an active layer and a second conductivity type semiconductor layer, and has a side surface. The active layer is provided on the first area of the first conductivity type semiconductor region. The second conductivity type semiconductor layer is provided on the active layer. The current block semiconductor region is provided on the second area of the first conductivity type semiconductor region and the side surface of the semiconductor mesa and confines carriers to the semiconductor mesa. The first DBR portion has a plurality of first DBR semiconductor layers and a plurality of second DBR semiconductor layers. The first DBR semiconductor layers and the second DBR semiconductor layers are arranged alternately. The second DBR portion has a plurality of third DBR semiconductor layers and a plurality of fourth DBR semiconductor layers. The third DBR semiconductor layers and the fourth DBR semiconductor layers are arranged alternately. The first conductivity type semiconductor region, the active layer and the second conductivity type semiconductor layer are provided between the first DBR portion and the second DBR portion. The active layer is made of III-V compound semiconductor including at least nitrogen (N) as a V group member.

In the surface emitting semiconductor device, the first conductivity type semiconductor region is made of semiconductor material enabling the first conductivity type semiconductor region to be a etch stopper resistant to etchant for etching the active layer and the second conductivity type semiconductor layer.

According to another aspect of the present invention, a surface emitting semiconductor device comprises: a first conductivity type semiconductor region, an active layer, a second conductivity type semiconductor layer, a current block semiconductor region, a first DBR portion, and a second DBR portion. The first conductivity type semiconductor region has a side surface, and is provided on a GaAs semiconductor region. The active layer has a side surface, and is provided on the first conductivity type semiconductor region. The second conductivity type semiconductor layer is provided on the active layer and has a side surface. The current block semiconductor region is provided on the side surface of the first conductivity type semiconductor region, the side surface of the active layer, and the side surface of the second conductivity type semiconductor layer. The first DBR portion has a plurality of first DBR semiconductor layers and a plurality of second DBR semiconductor layers. The first DBR semiconductor layers and the second DBR semiconductor layers are arranged alternately. The second DBR portion has a plurality of third DBR semiconductor layers and a plurality of fourth DBR semiconductor layers. The third DBR semiconductor layers and the fourth DBR semiconductor layers are arranged alternately. The first conductivity type semiconductor region, the active layer and the second conductivity type semiconductor layer are provided between the first DBR portion and the second DBR portion. The current block semiconductor region confines carriers to the first conductivity type semiconductor region, the active layer, and the second conductivity type semiconductor layer. The active layer is made of III-V compound semiconductor including at least nitrogen element as a V group member.

In these surface emitting semiconductor devices, III-V compound semiconductor of the active layer contains at least gallium (Ga) as a III group member. The III-V compound semiconductor of the active layer contains at least arsenic (As) as a V group member.

In the surface emitting semiconductor devices, the active layer is made of at least one of GaInNAs semiconductor, GaNAs semiconductor, GaNAsSb semiconductor, GaNAsP semiconductor, GaNAsSbP semiconductor, GaInNAsSb semiconductor, GaInNAsP semiconductor and GaInNAsSbP semiconductor.

In the surface emitting semiconductor devices, the second conductivity type semiconductor layer has a refractive index higher than that of the current block semiconductor region.

In the surface emitting semiconductor devices, an additional semiconductor layer made of III-V compound semiconductor can be further included. The additional semiconductor layer is provided between the first conductivity type semiconductor region and the active layer. A photoluminescence wavelength of the III-V compound semiconductor of the additional semiconductor layer is between that of the active layer and that of the first conductivity type semiconductor region.

In the surface emitting semiconductor devices, an additional semiconductor layer made of III-V compound semiconductor can be further included. The additional semiconductor layer is provided between the second conductivity type semiconductor layer and the active layer. A photoluminescence wavelength of the III-V compound semiconductor of the additional semiconductor layer is between that of the active layer and that of the second conductivity type semiconductor layer.

In the surface emitting semiconductor devices, a first SCH layer and a second SCH layer can be further included. The first SCH layer is provided between the first conductivity type semiconductor region and the active layer. The second SCH layer is provided between the active layer and the second conductivity type semiconductor layer.

In the surface emitting semiconductor devices, an additional semiconductor layer made of III-V compound semiconductor can be further included. The additional semiconductor layer is provided between the first conductivity type semiconductor region and the first SCH layer. A photoluminescence wavelength of the III-V compound semiconductor of the additional semiconductor layer is between that of the first SCH layer and that of the first conductivity type semiconductor layer.

In the surface emitting semiconductor devices, an additional semiconductor layer made of III-V compound semiconductor can be further included. The additional semiconductor layer is provided between the second conductivity type semiconductor layer and the second SCH layer. A photoluminescence wavelength of the III-V compound semiconductor of the additional semiconductor layer is between that of the second SCH layer and that of the second conductivity type semiconductor layer.

In the surface emitting semiconductor devices, the current block semiconductor region includes first and second current block layers. The first conductivity type semiconductor region is made of $(Al_{X1}Ga_{1-X1})_{Y1}In_{1-Y1}P$ semiconductor, where a composition X1 has a value in a range of zero or greater but not greater than 1. The second conductivity type semiconductor layer is made of $(Al_{X2}Ga_{1-X2})_{Y2}In_{1-Y2}P$ semiconductor, where a composition X2 has a value in a range of zero or greater but not greater than 1. The first and second current block layers are made of $(Al_{X3}Ga_{1-X3})Y_{Y3}In_{1-Y3}P$ semiconductor, where a composition X3 has a value in a range of zero or greater but not greater than 1.

In the surface emitting semiconductor devices, the current block semiconductor region includes first and second current block layers. The first conductivity type semiconductor region is made of an $Al_{X1}Ga_{1-X1}As$ semiconductor, where a composition X1 has a value in a range of zero or greater but not greater than 1. The second conductivity type semiconductor layer is made of an $Al_{X2}Ga_{1-X2}As$ semiconductor, where a composition X2 has a value in a range of zero or greater but not greater than 1. The first and second current block layers are made of $Al_{X3}Ga_{1-X3}As$ semiconductor, where a composition X3 has a value in a range of zero or greater but not greater than 1.

In the surface emitting semiconductor devices, the first and second SCH layers is made of one of $Al_{X1}Ga_{1-X1}As$ semiconductor ($0 \leq X1 \leq 1$) and $Ga_{X2}In_{1-X2}As_{Y2}P_{1-Y2}$ semiconductor (about $0.5 \leq X2 \leq 1$, $0 \leq Y2 \leq 1$) lattice-matched to GaAs semiconductor.

In the surface emitting semiconductor devices, the current block semiconductor region includes first and second current block layers. The first and second current block semiconductor layers are made of material not containing aluminum as a III group element.

In the surface emitting semiconductor devices, the current block semiconductor region includes first and second current block layers. The first and second current block semiconductor layers are made of material not containing aluminum as a III group element. The first conductivity type semiconductor region is made of material not containing aluminum as a III group element. The second conductivity type semiconductor layer is made of material not containing aluminum as a III group element.

In the surface emitting semiconductor devices, the GaAs semiconductor region is provided by one of a GaAs semiconductor layer and a gallium arsenide substrate.

In the surface emitting semiconductor devices, the surface emitting semiconductor device is constituted to provide at least one of a semiconductor laser diode and a semiconductor optical amplifier.

In the surface emitting semiconductor devices, the GaAs semiconductor region is provided between the first DBR portion and the second DBR portion.

In the surface emitting semiconductor devices, the second DBR portion is provided between the first DBR portion and the GaAs semiconductor region.

BRIEF DESCRIPTION OF THE DRAWINGS

The above object and other objects, features, and advantages of the present invention will become apparent more easily in the detailed description of the preferred embodiments of the present invention which will be described below with reference to the accompanying drawings.

DESCRIPTION OF THE PREFERRED EMBODIMENTS

The teachings of the present invention will readily be understood in view of the following detailed description with reference to the accompanying drawings illustrated by way of example. Referring to the accompanying drawings, embodiments of the surface emitting semiconductor device according to the present invention will now be explained. When possible, parts identical to each other will be referred to with numerals identical to each other.

First Embodiment

Figure 1:
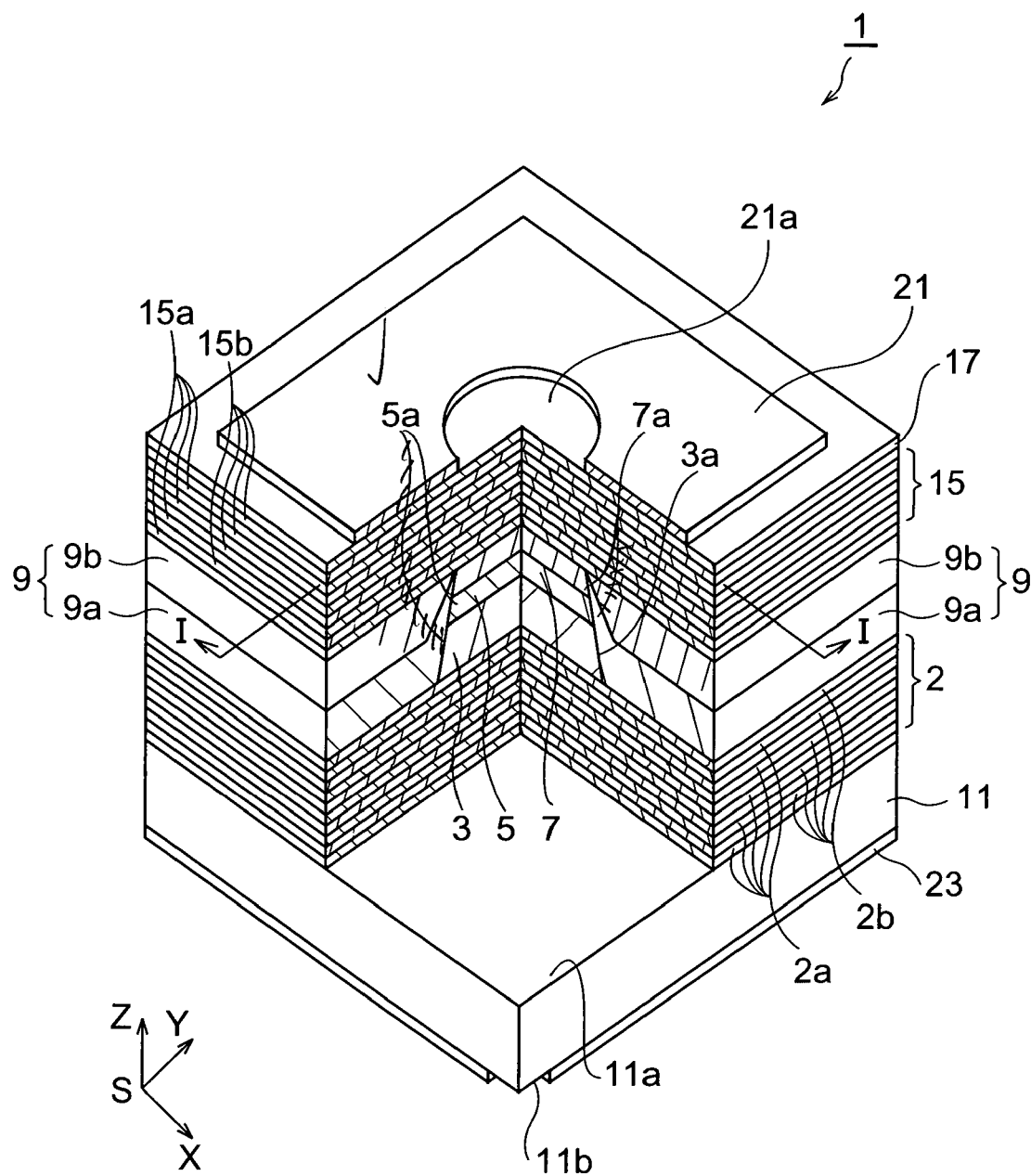
FIG. 1 is a perspective view showing a surface emitting semiconductor device in accordance with the first embodiment.
Figure 2A:
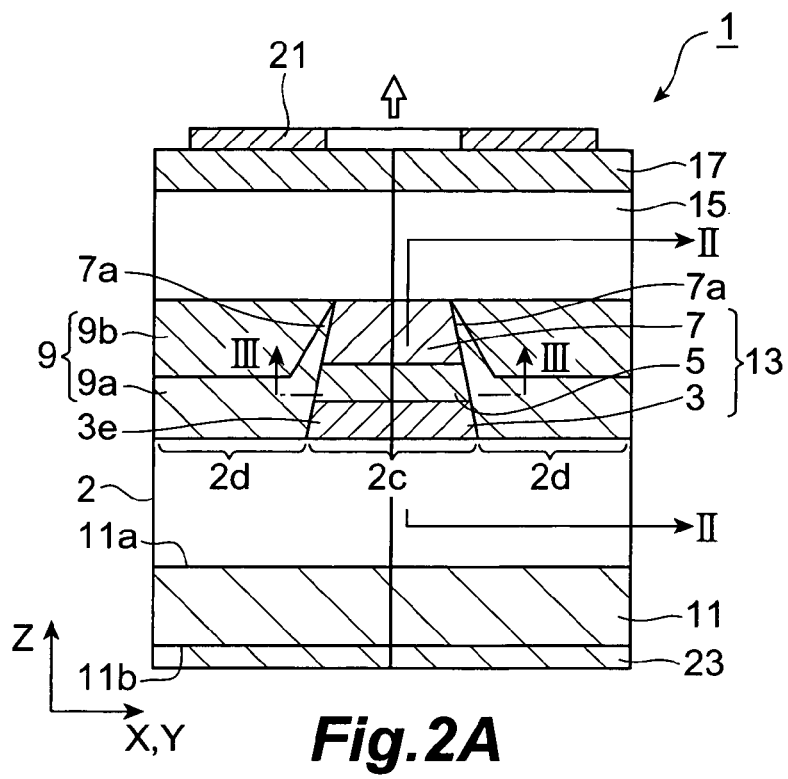
FIG. 2A is a cross sectional view showing the surface emitting semiconductor device taken along the line I-I shown in FIG. 1.
Figure 2B:
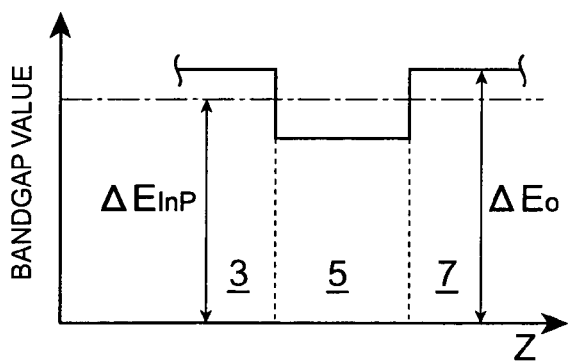
FIG. 2B is a diagram showing the band gap taken along the line II-II of FIG. 2A.
Figure 2C:
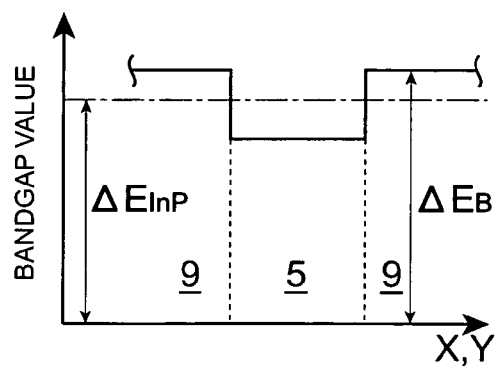
FIG. 2C is a diagram showing the band gap taken along the line III-III of FIG. 2A.
Figure 2D:
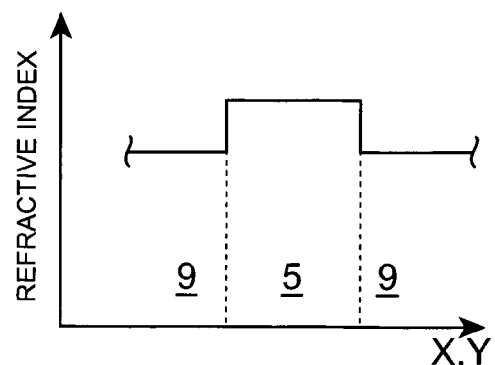
FIG. 2D is a diagram showing the refractive index taken along the line III-III of FIG. 2A.

FIG. 1 is a perspective view showing the surface emitting semiconductor device in accordance with a first embodiment. XYZ-coordinate system S is shown in FIG. 1. FIG. 2A is a cross sectional view taken along the line I-I shown in FIG. 1. FIG. 2B is a diagram showing the band gap taken along the line II-II of FIG. 2A. FIG. 2C is a diagram showing the band gap taken along the line III-III of FIG. 2A. FIG. 2D is a diagram showing the refractive index taken along the line II-II of FIG. 2A.

Referring to FIGS. 1 and 2A, a surface emitting semiconductor device 1, such as a buried heterostructure semiconductor laser device, is illustrated. This surface emitting semiconductor device 1 comprises a first DBR portion 2, a semiconductor region of a first conductivity type 3, an active layer 5, a semiconductor layer of a second conductivity type 7, a current block semiconductor region 9, and a second DBR portion 15. The first conductivity type semiconductor region 3 has a side surface 3a and is provided on a surface made of GaAs semiconductor. The active layer has a side surface 5a and is provided on the first conductivity type semiconductor region 3. The second conductivity type semiconductor layer 7 has a side surface 7a and is provided on the active layer 5. The current block semiconductor region 9 confines current flowing through the first conductivity type semiconductor region 3, the active layer 5 and the second conductivity type semiconductor layer 7. The first DBR portion 2 has first DBR semiconductor layers 2a and second DBR semiconductor layers 2b, and the first DBR semiconductor layers 2a and the second DBR semiconductor layers 2b are alternately arranged. The second DBR portion 15 has third DBR semiconductor layers 15a and fourth DBR semiconductor layers 15b, and the third DBR semiconductor layers 15a and the fourth DBR semiconductor layers 15b are alternately arranged. The first conductivity type semiconductor region 3, the active layer 5 and the second conductivity type semiconductor layer 7 are provided between the first DBR portion 2 and the second DBR portion 15. The current block semiconductor region 9 is provided on the following: the side 3a of the first conductivity type semiconductor region 3, the side surface 5a of the active layer 5, and the side surface 7a of the second conductivity type semiconductor layer 7. The active layer 5 is made of III-V semiconductor compound containing at least nitrogen element.

Current flowing through the surface emitting semiconductor laser 1 is confined to the first conductive type semiconductor layer 3, the active layer 5 and the second conductive type semiconductor layer 7 because the current block semiconductor region is provided on the following: the side surface 3a of the first conductive type semiconductor layer 3, the side surface 5a of the active layer 5 and the side surface 7a of the second conductive type semiconductor layer 7.

The surface emitting semiconductor device 1 does not have an isolation region provided for confining the current, which is formed by implanting proton ions into a predetermined semiconductor region to modify it into insulative. Thus, the surface emitting semiconductor device 1 effectively confines the current as compared to a surface emitting semiconductor device using an ion-implanted isolation region. Further, the surface emitting semiconductor device 1 does not include the ion-implanted isolation region, the confinement performance of current by the current block semiconductor region 9 is not degraded by the heating step in the manufacturing process.

The surface emitting semiconductor device 1 does not have an insulating region of $Al_2O_3$, formed by partially oxidizing an AlAs semiconductor layer to form a current path, which is provided for confining the current. The size of the current path can be easily controlled in the manufacturing process as compared to a surface emitting semiconductor device using the insulating region of $Al_2O_3$ because the current path in the surface emitting semiconductor device 1 is defined by a photolithography step. The surface emitting semiconductor device 1 does not have an insulating region of $Al_2O_3$ formed by oxidizing a part of the AlAs layer, thereby reducing the occurrence of the peeling of epitaxial layers due to the formation of the insulating region of $Al_2O_3$.

The surface emitting semiconductor device 1 includes the active layer 5 that is provided on a GaAs substrate and is made of a III-V compound semiconductor including at least nitrogen element as a V group member. Accordingly, the surface emitting semiconductor device 1 uses semiconductor materials, lattice-matched to GaAs semiconductor, having a band gap higher than that of InP semiconductor for the first conductivity type semiconductor region 3, the second conductivity type semiconductor layer 7 and the current block semiconductor region 9. The heterobarrier associated with the active layer 5 in the surface emitting semiconductor device 1 can be made higher than that in InGaAsP/InP semiconductor optical devices.

Since the surface emitting semiconductor device 1 has a buried heterostructure, it is superior to InP/GaInAsP semiconductor lasers of a ridge structure in terms of the confinement of carriers. Consequently, the semiconductor laser with a buried heterostructure lowers the ineffective current and enhances the interaction between carriers and photons, thereby attaining improvement in differential efficiency and reduction in threshold current.

The first conductivity type semiconductor region 3 is made of a III-V compound semiconductor, whereas this III-V compound semiconductor has a photoluminescence wavelength shorter than that of the active layer 5. The second conductivity type semiconductor layer 7 is made of a III-V compound semiconductor, whereas this III-V compound semiconductor has a photoluminescence wavelength shorter than that of the active layer 5. The current block semiconductor region 9 is made of a III-V compound semiconductor, whereas this III-V compound semiconductor has a photoluminescence wavelength shorter than that of the active layer 5. Here, the photoluminescence wavelength value of a semiconductor material is equal to the wavelength value corresponding to the band gap energy of the semiconductor material.

In the surface emitting semiconductor device 1, the active layer 5 is provided so as to generate light of a wavelength longer than 0.9 micrometers.

The surface emitting semiconductor device 1 can be, for example, a laser diode having a laser cavity. A first DBR portion 2 and a second DBR portion 15 can be used to constitute a laser cavity. Current in the surface emitting semiconductor device flows through the first conductive type semiconductor region 3, the active layer 5 and the second conductive semiconductor layer 7 that are surrounded by the current block semiconductor region 9. The first DBR portion 2 and the second DBR portion 15 reflect light generated by the active layer 5 to amplify it. The amplified version of the light is emitted through one of the first DBR portion 2 and the second DBR portion 15.

The first conductive type semiconductor region 3 is made of III-V compound semiconductor. The photoluminescence wavelength of this III-V compound semiconductor is shorter that that of the active layer 5.

The second conductive type semiconductor region 7 is made of III-V compound semiconductor. The photoluminescence wavelength of this III-V compound semiconductor is shorter that that of the active layer 5. Here, The photoluminescence wavelength of the material corresponds to the band gap energy thereof.

As shown in the band gap diagram of FIG. 2B, the first conductivity type semiconductor region 3 and the second conductivity type semiconductor layer 7 act to confine carriers into the active layer 5. As a result, the first conductivity type semiconductor region 3 works as a cladding layer of the first conductivity type, whereas the second conductivity type semiconductor layer 7 works as a cladding layer of the second conductivity type. After carriers are injected into the active layer 5 from the first conductivity type semiconductor region 3 and from the second conductivity type semiconductor layer 7, the carriers are confined into the active layer 5 and generate light.

As shown in FIG. 2B, the cladding layers of the surface emitting semiconductor device 1 has a band gap value $\Delta E_0$ greater than the band gap value $\Delta E_{InP}$ of a cladding layers of InP semiconductor used in the InP/InGaAsP surface emitting semiconductor device, so that the carrier confinement in the surface emitting semiconductor device 1 in the z-direction is superior to that of the InP/InGaAsP surface emitting semiconductor devices.

The current block semiconductor region 9 is made of a III-V compound semiconductor, whereas this III-V compound semiconductor exhibits a photoluminescence wavelength value shorter than that of the active layer 5. Therefore, as shown in the band gap diagram of FIG. 2C, the current block semiconductor region 9 works as a semiconductor layer for blocking current. As shown in FIG. 2C, the current block semiconductor region 9 in the surface emitting semiconductor device 1 exhibits a band gap value $\Delta E_B$ higher than the band gap value $\Delta E_{InP}$ of the cladding layer made of InP semiconductor used in InP/InGaAsP surface emitting semiconductor device, whereby the carrier confinement of the surface emitting semiconductor device 1 is superior to that of the InP/InGaAsP surface emitting semiconductor device in the x- and y-directions.

The surface emitting semiconductor device 1 further comprises a semiconductor substrate 11. For example, a GaAs semiconductor substrate can be used as the semiconductor substrate 11. The GaAs semiconductor substrate provides the surface of GaAs semiconductor on which the first conductivity type semiconductor region 3 is formed. The first DBR portion 2 is provided on a primary surface 11a of the semiconductor substrate 11. The first conductivity type semiconductor region 3 is provided on the first DBR portion 2. The first conductivity type semiconductor region 3 is formed into a mesa, and is provided between the current block semiconductor region 9. The active layer 5 and the second conductivity type semiconductor layer 7 are formed into a mesa, and are surrounded by the current block semiconductor region 9. The active layer 5 is provided between the first conductivity type semiconductor region 3 and the second conductivity type semiconductor layer 7. The first conductivity type semiconductor region 3, the active layer 5, and the second conductivity type semiconductor layer 7 constitute a semiconductor mesa 13. The semiconductor mesa 13 extends along a predetermined axis directed from the first DBR portion 2 to the second DBR portion 15. In the semiconductor mesa 13, carriers are injected into the active layer 5 from the second conductivity type semiconductor layer 7 and from the first conductivity type semiconductor region 3.

In the surface emitting semiconductor device 1, the first DBR portion 2 is provided on the semiconductor substrate 1. The first conductive type semiconductor layer 3, the active layer 5, the second conductive type semiconductor layer 7 and the current block region 9 are provided on the first DBR portion 2. On the first DBR portion 2, the current block region 9 surrounds the first conductive type semiconductor layer 3, the active layer 5 and the second conductive type semiconductor layer 7. The second DBR portion 15 is provided on the current block semiconductor region 9 and the semiconductor mesa 13. The surface emitting semiconductor device 1 can be a planer device. From the point of view of optical elements, each of the first DBR portion 2 and the second DBR portion 15 works as a Bragg grating. For example, the first DBR portion 2 has first DBR semiconductor layers 2a and second DBR semiconductor layers 2b. The refractive index of the first DBR semiconductor layers 2a is different from that of the second DBR semiconductor layers 2b. The first DBR portion 2 has an optical spectrum substantially determined by the thickness values of the first DBR semiconductor layers 2a and second DBR semiconductor layers 2b. This optical spectrum enables the first DBR portion 2 to reflect a part of light having wavelength components generated by the active layer 5 and to filter out another part of the light.

The surface emitting semiconductor device 1 having such a refractive index structure and a band gap structure enhance the carrier confinement in both lateral transverse and vertical transverse directions, thereby lowering the threshold current, increasing the slope efficiency, and improving the temperature characteristic.

The surface emitting semiconductor device 1 further comprises a second conductivity type semiconductor layer 17, and electrodes 21 and 23. The second conductivity type semiconductor layer 17 is provided on the second conductivity type semiconductor layer 15. The electrode 21 is provided on the second conductivity type semiconductor layer 17. The electrode 23 is provided on the rear surface 11b of the substrate 11. An opening 21a is formed in at least one of the electrode 21 and the electrode 23 in order to avoid blocking light from the active layer. The opening 21a is positioned to the semiconductor mesa 13.

In the surface emitting semiconductor device 1, the current block semiconductor region 9 has a first current block layer 9a and a second current block layer 9b. The conductivity type of the first current block layer 9a is different from that of the second current block layer 9b. Since the semiconductor layers 9a and 9b in the current block semiconductor region 9 form a p-n junction, the current block semiconductor region 9 serves to block the current.

In the surface emitting semiconductor device 1 shown in FIGS. 1 and 2A, the first current block layer 9a is made of semiconductor material of the second conductivity type, and the second current block layer 9b is made of semiconductor material of the first conductivity type. The first current block layer 9a is provided between the second current block layer 9b of the first conductivity type semiconductor and the first DBR portion 2 having the first conductive type, whereas the second current block layer 9b is provided between the first current block layer 9a of the second conductivity type semiconductor and the DBR portion 15 having the second conductivity type. Hence, the second conductivity type semiconductor portion 15, the first conductivity type semiconductor region 3 and the current block semiconductor region 9 construct a p-n-p-n or n-p-n-p structure.

A first example of the surface emitting semiconductor device 1 is presented as below.
  the first DBR portion 2
  the first DBR semiconductor layer: n-type AlGaAs
  the second DBR semiconductor layer: n-type GaAs
  the first conductivity type semiconductor region 3: n-type AlGaInP or GaInP;
  the active layer 5: undoped (hereinafter referred to as "un") GaInNAs, un-GaNAs, un-GaNAsSb, un-GaNAsP, un-GaNAsSbP, un-GaInNAsSb, un-GaInNAsP, and/or un-GaInNAsSbP;
  the second conductivity type semiconductor layer 7: p-type AlGaInP semiconductor and/or GaInP semiconductor;
  the second DBR portion 15:
  the third DBR layer: p-type AlGaAs;
  the fourth DBR layer: p-type GaAs;
  the first current block semiconductor layer 9a: p-type AlGaInP semiconductor, p-type AlGaAs semiconductor, p-type GaAs semiconductor, or p-type GaInP semiconductor;
  the second current block semiconductor layer 9b: n-type AlGaInP semiconductor, n-type GaInP semiconductor, n-type AlGaAs semiconductor, and/or n-type GaAs semiconductor;
  the substrate 11: n-type heavily doped GaAs substrate; and
  the contact layer 17: p-type GaAs semiconductor.

In this example, the first conductivity type semiconductor region 3 and the second conductivity type semiconductor layer 7 may be made of an $(Al_xGa_{1-x})_yIn_{1-y}P$ semiconductor lattice-matched to GaAs semiconductor, whereas each of the first and second current block layers 9a and 9b may be made of an $Al_xGa_{1-x}As$ semiconductor or an $(Al_xGa_{1-x})_yIn_{1-y}P$ semiconductor lattice-matched to GaAs semiconductor. In these semiconductor crystals, a composition "X" has a value within the range of zero or greater but not greater than 1. Using these semiconductor materials can improve the carrier confinement at the following interfaces: the active layer 5 and the current block semiconductor regions 9; the active layer 5 and the first conductivity type semiconductor region 3; and the active layer 5 and the second conductivity type semiconductor layer 7.

A second example of the surface emitting semiconductor device 1 is present as below:
  the first DBR portion 2
  the first DBR semiconductor layer: n-type AlGaAs
  the second DBR semiconductor layer: n-type GaAs
  the first conductivity type semiconductor region 3: n-type AlGaAs semiconductor and/or n-type GaAs semiconductor;
  the active layer 5: un-GaInNAs, un-GaNAs, un-GaNAsSb, un-GaNAsP, un-GaNAsSbP, un-GaInNAsSb, un-GaInNAsP and/or un-GaInNAsSbP;
  the second conductivity type semiconductor layer 7: p-type AlGaAs semiconductor and/or p-type GaAs semiconductor;
  the second DBR portion 2
  the third DBR semiconductor layer: p-type AlGaAs
  the fourth DBR semiconductor layer: p-type GaAs
  the first current block semiconductor layer 9a: p-type AlGaInP semiconductor, p-type AlGaAs semiconductor, p-type GaAs semiconductor, and/or p-type GaInP semiconductor;
  the second current block semiconductor layer 9b: n-type AlGaInP semiconductor, n-type GaInP semiconductor, n-type AlGaAs semiconductor, and/or n-type GaAs semiconductor;
  the substrate 11: heavily doped n-type GaAs substrate; and
  the contact layer 17: p-type GaAs semiconductor.

In the surface emitting semiconductor device 1 of this example, the first conductivity type semiconductor region 3 and the second conductivity type semiconductor layer 7 may be made of an $Al_xGa_{1-x}As$ semiconductor, whereas each of the first and second current block layers 9a and 9b may be made of an $Al_xGa_{1-x}As$ semiconductor or an $(Al_xGa_{1-x})_yIn_{1-y}P$ semiconductor that is lattice-matched to GaAs semiconductor. In these semiconductor crystals, parameter "X" has a value within the range of zero or greater zero but not greater than 1. Using this semiconductor material can improve the carrier confinement at the following interfaces: the active layer 5 and the current block semiconductor region 9; the active layer 5 and the first conductivity type semiconductor region 3; and the active layer 5 and the second conductivity type semiconductor layer 7.

In the surface emitting semiconductor device 1 using the above-mentioned semiconductor materials, the active layer 5 can generate light having a wavelength of 0.9 micrometers or longer.

As shown in In FIG. 2B, InP semiconductor has band gap $\Delta E_{InP}$ and the semiconductor material of the cladding layers of the surface emitting semiconductor device 1 has a band gap $\Delta E_0$. As can be seen from FIG. 2B, the band gap $\Delta E_0$ is greater than the band gap $\Delta E_{InP}$. That is, the band gap difference of the heterojunctions between the active layer 5 (which is made of one of GaInNAs, GaNAs, GaNAsSb, GaNAsP, GaNAsSbP, GaInNAsSb, GaInNAsP, and GaInNAsSbP semiconductors) and the p-type and n-type cladding layers (which are made of p-type AlGaInP, n-type AlGaInP, p-type AlGaAs, or n-type AlGaAs semiconductor) can be made greater than the band gap difference between InP semiconductor and GaInAsP semiconductor, where InP semiconductor has a band gap energy of $2.16 \times 10^{-19}$ joules (1.35 eV). As shown in FIG. 2C, this explanation similarly applies to the active layer 5 and the current block semiconductor region 9.

Figure 3A:
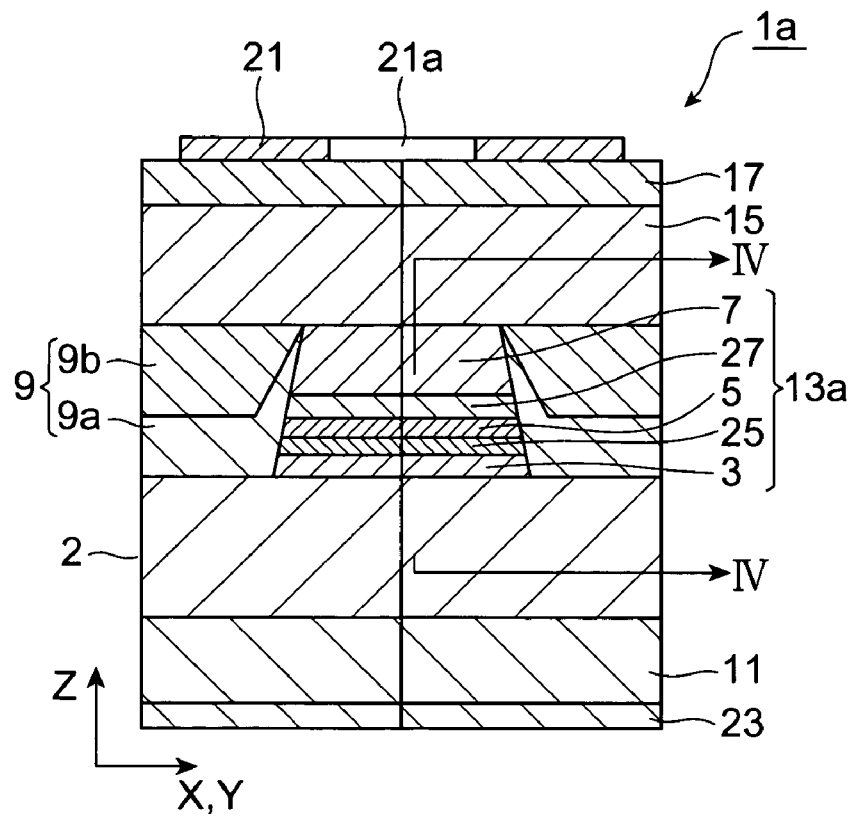
FIG. 3A is a cross sectional view showing a modified surface emitting semiconductor device in accordance with the present embodiment.
Figure 3B:
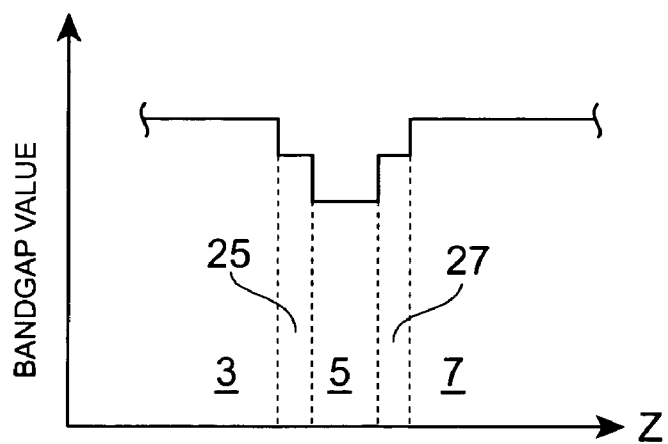
FIG. 3B is a diagram showing the band gap taken along the line IV-IV of FIG. 3A.

FIG. 3A is a cross sectional view showing a modified surface emitting semiconductor device in accordance with the first embodiment. FIG. 3B is a diagram showing the band gap taken along the line IV-IV of FIG. 3A. The surface emitting semiconductor device 1a may further comprise a first SCH layer 25 and a second SCH layer 27. The first SCH layer 25 is provided between the first conductivity type semiconductor region 3 and the active layer 5. The second SCH layer 27 is provided between the active layer 5 and the second conductivity type semiconductor layer 7. The side surfaces of first and second SCH layers 25 and 27 are surrounded by the current block region 9. The first conductivity type semiconductor region 3, the active layer 5, the second conductivity type semiconductor layer 7, and the first and second SCH layers 25 and 27 constitute a semiconductor mesa 13a.

The photoluminescence wavelength of the first SCH layer 25 is between that of the active layer 5 and that of the first conductivity type semiconductor region 3. The photoluminescence wavelength of the second SCH layer 27 is between that of the active layer 5 and that of the second conductivity type semiconductor layer 7. Carriers are injected into the active layer 5 by way of the first and second SCH layers 25 and 27 from the second conductivity type semiconductor layer 7 and the first conductivity type semiconductor region 3, respectively. As shown in FIG. 3B, the first and second SCH layers 25 and 27 act to confine the injected carriers into the active layer 5 in the surface emitting semiconductor device 1a.

The first and second SCH semiconductor layers 25 and 27 are made of the following: un-$Al_xGa_{1-x}As$ ($0 \leq X \leq 1$), un-GaAs and/or a $Ga_xIn_{1-x}As_yP_{1-y}$ semiconductor (about $0.5 \leq X \leq 1$, $0 \leq Y \leq 1$) lattice-matched to GaAs semiconductor. In the above example, a GaInAsP semiconductor is lattice-matched to GaAs semiconductor.

In the surface emitting semiconductor device using the above materials, the photoluminescence wavelength of the first SCH semiconductor layer 25 falls within a value between that of the first conductivity type semiconductor region 3 and that of the active layer 5, and the photoluminescence wavelength of the second SCH semiconductor layer 27 falls within a value between that of the second conductivity type semiconductor layer 7 and that of the active layer 5. Accordingly, carriers can be confined well into the active layer 5.

Figure 4A:
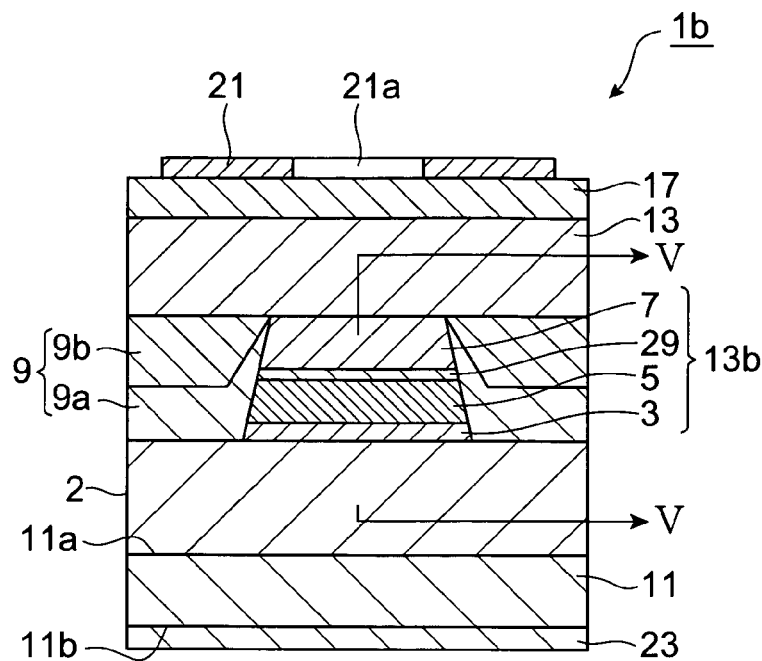
FIG. 4A is a cross sectional view showing a modified surface emitting semiconductor device in accordance with the present embodiment.
Figure 4B:
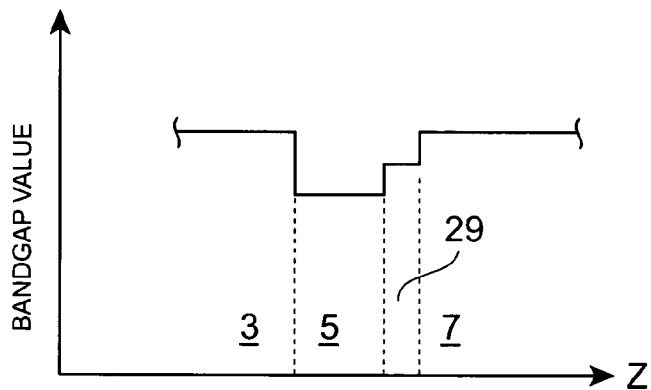
FIG. 4B is a diagram showing the band gap taken along the line V-V of FIG. 4A.
Figure 4C:
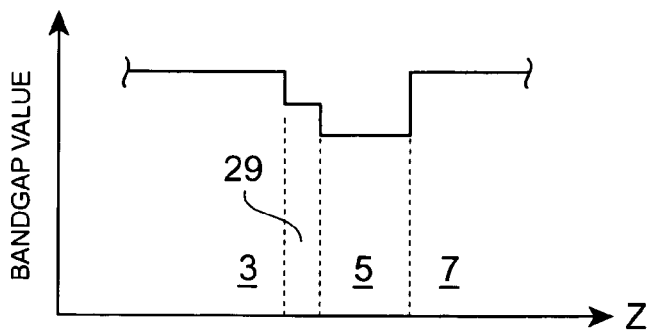
FIG. 4C is a diagram showing the band gap of a modified surface emitting semiconductor device taken along a line equivalent to the line V-V of FIG. 4A.

FIG. 4A is a cross sectional view showing a modified surface emitting semiconductor device in accordance with the first embodiment. FIG. 4B is a diagram showing the band gap taken along the line V-V of FIG. 4A. FIG. 4C is a diagram showing the band gap taken along a line equivalent to the line V-V of FIG. 4A. The surface emitting semiconductor device 1b may further comprise an additional semiconductor layer 29 made of a III-V compound semiconductor. The additional semiconductor layer 29 is provided in at least one of the following arrangements: between the first conductivity type semiconductor region 3 and the active layer 5; and between the second conductivity type semiconductor layer 7 and the active layer 5. If the additional semiconductor layer 29 is provided between the second conductivity type semiconductor layer 7 and the active layer 5 as in the surface emitting semiconductor device 1b, the III-V compound semiconductor of the additional semiconductor layer 29 has a photoluminescence wavelength value between that of the active layer 5 and that of the second conductivity type semiconductor layer 7 as shown in FIG. 4B. If the additional semiconductor layer 29 is provided between the first conductivity type semiconductor region 3 and the active layer 5, the III-V compound semiconductor of the additional semiconductor layer 29 exhibits a photoluminescence wavelength value between that of the active layer 5 and that of the first conductivity type semiconductor region 3. The first conductivity type semiconductor region 3, the active layer 5, the second conductivity type semiconductor layer 7, and the additional semiconductor layer 29 constitute a semiconductor mesa 13b.

The additional semiconductor layer 29 satisfying the above relationship of photoluminescence wavelengths lowers spikes and notches at the heterojunction interfaces, thereby alleviating the heterobarrier in the following arrangements: between the active layer 5 and the first conductivity type semiconductor region 3; between the active layer 5 and the second conductivity type semiconductor layer 7.

In FIG. 4A, the surface emitting semiconductor device 1b comprises the additional semiconductor layer 29 provided between the second conductivity type semiconductor layer 7 and the active layer 5, but it may be provided between the first conductivity type semiconductor region 3 and the active layer 5 as shown in FIG. 4C. Additional semiconductor layers may be provided on both sides of the active layer 5.

In an example of the surface emitting semiconductor device 1b, the semiconductor layer 29 is made of p-type AlGaAs, p-type AlGaInP, p-type GaInP, and/or p-type GaInAsP.

Figure 5:
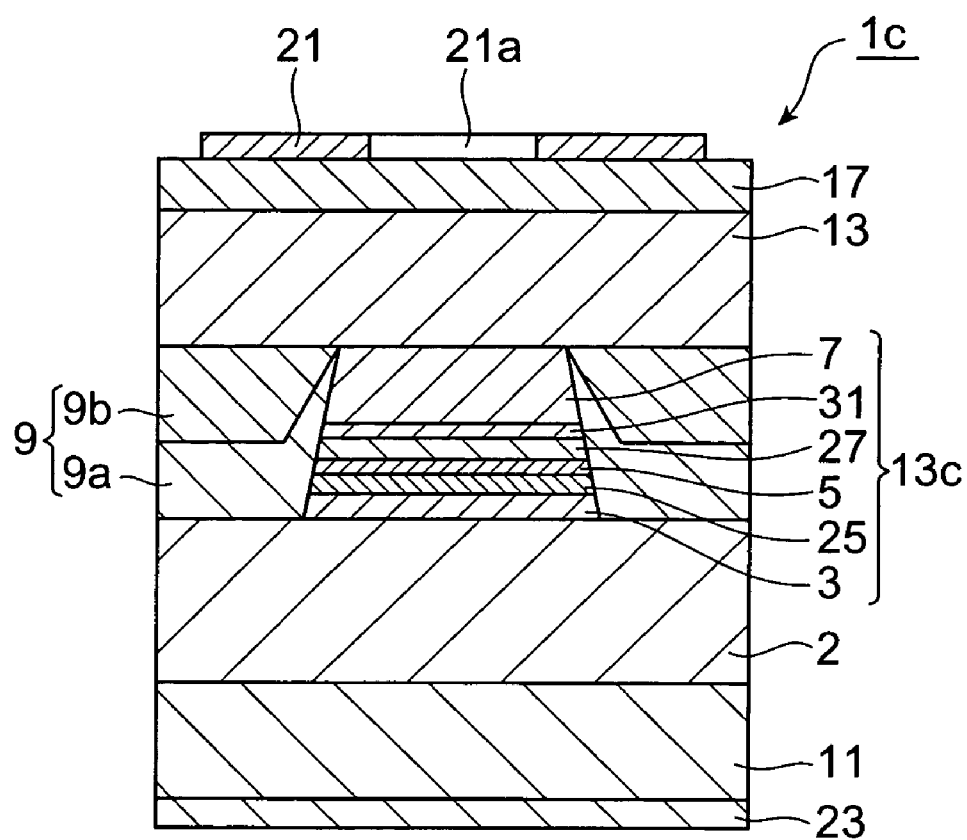
FIG. 5 is a cross sectional view showing a modified surface emitting semiconductor device in accordance with the present invention.

FIG. 5 is a cross sectional view showing a modified surface emitting semiconductor device in accordance with the first embodiment. The surface emitting semiconductor device 1c shown in FIG. 5 may comprise SCH layers 25 and 27 and an additional semiconductor layer 31 made of a III-V compound semiconductor. The additional semiconductor layer 31 is provided between the second conductivity type semiconductor layer 7 and the second SCH layer 27. If the additional semiconductor layer 31 is provided between the second conductivity type semiconductor layer 7 and the second SCH layer 27 as in the surface emitting semiconductor device 1c, the III-V compound semiconductor of the additional semiconductor layer 31 exhibits a photoluminescence wavelength value between that of the second SCH layer 27 and that of the second conductivity type semiconductor layer 7. If the additional semiconductor layer 31 is provided between the first conductivity type semiconductor region 3 and the first SCH layer 25, the III-V compound semiconductor of the additional semiconductor layer 31 has a photoluminescence wavelength value between that of the first SCH layer 25 and that of the first conductivity type semiconductor region 3. The first conductivity type semiconductor region 3, the active layer 5, the second conductivity type semiconductor layer 7, the first and second SCH layers 25 and 27, and the additional semiconductor layer 31 constitute a semiconductor mesa 13c.

The additional semiconductor layer 31 may be provided in at least one of the following arrangements: between the first conductivity type semiconductor region 3 and the first SCH layer 25; and between the second conductivity type semiconductor layer 7 and the second SCH layer 27.

The additional semiconductor layer 31 satisfying the above relationship of photoluminescence wavelengths lowers spikes and notches at heterojunction interfaces, thereby alleviating the heterobarrier in the following arrangements: between the first SCH layer 25 and the first conductivity type semiconductor region 3; and between the second SCH layer 27 and the second conductivity type semiconductor layer 7.

In an example of the surface emitting semiconductor device 1c, the semiconductor layer 31 is made of p-type AlGaAs, p-type AlGaInP, p-type GaInP, and/or p-type GaInAsP.

As seen from the above description, the surface emitting semiconductor device improves the confinement of current flowing through the semiconductor mesa.

Second Embodiment

Figure 6:
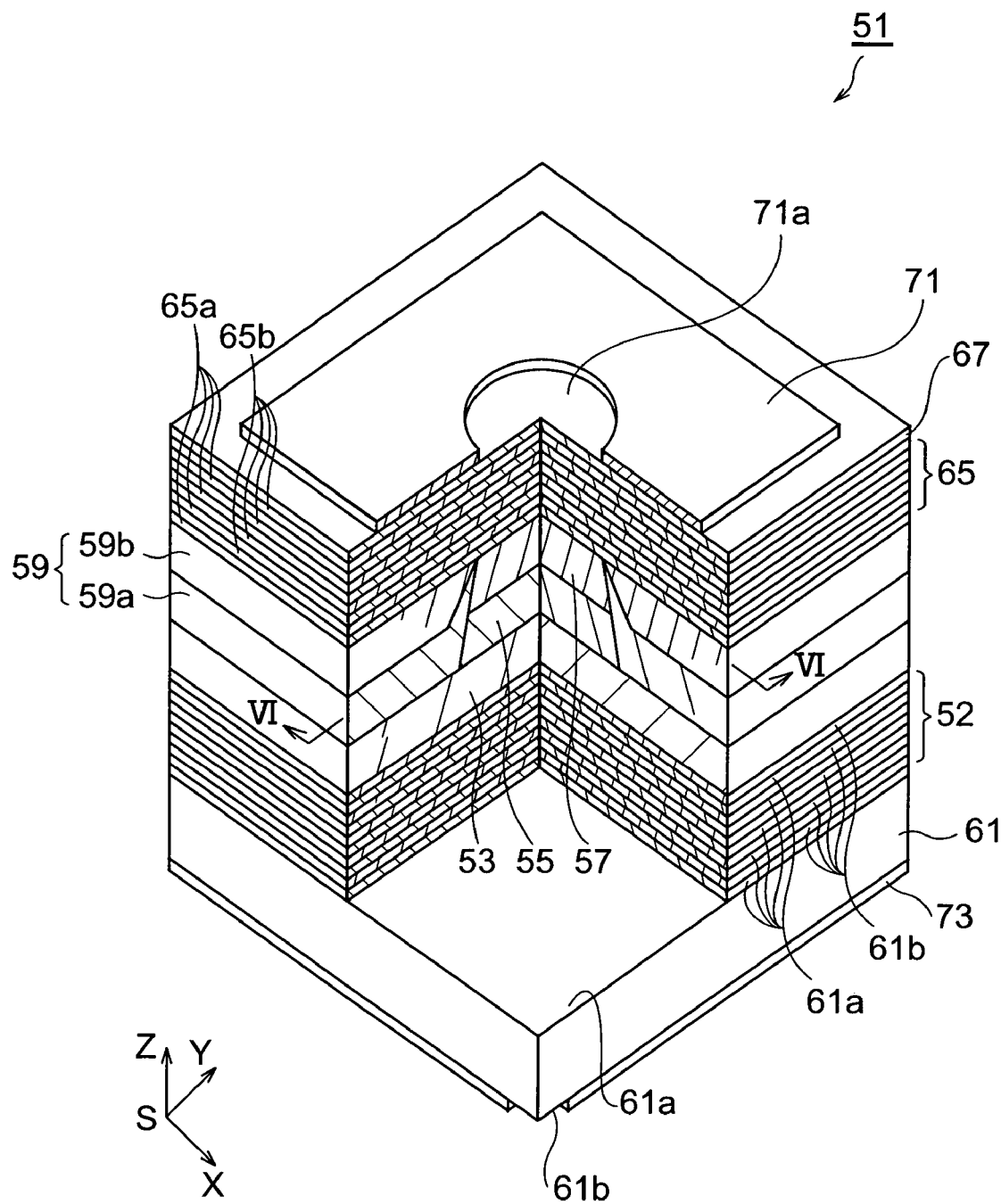
FIG. 6 is a perspective view showing a surface emitting semiconductor device in accordance with the second embodiment.
Figure 7A:
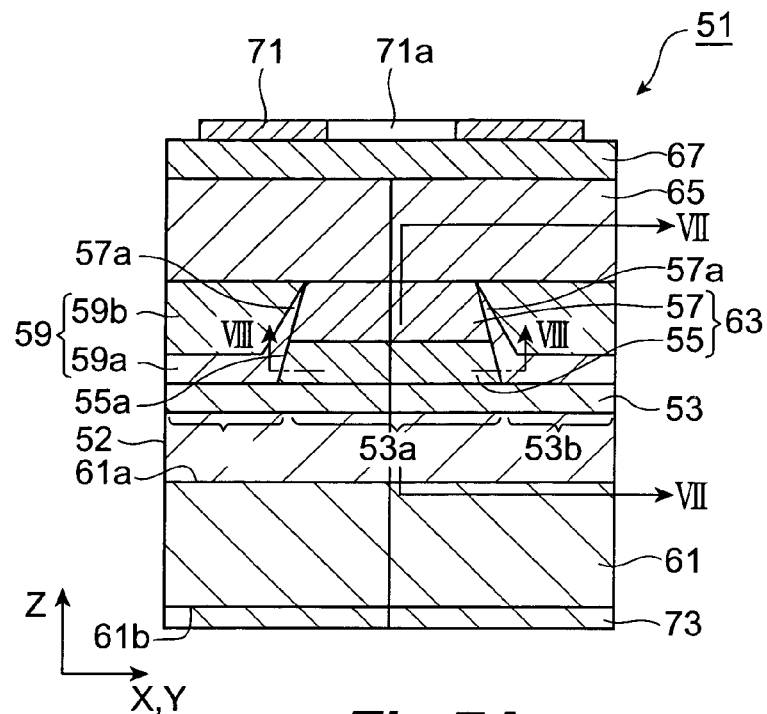
FIG. 7A is a cross sectional view taken along the line VI-VI shown in FIG. 6.
Figures 7B, 7C:
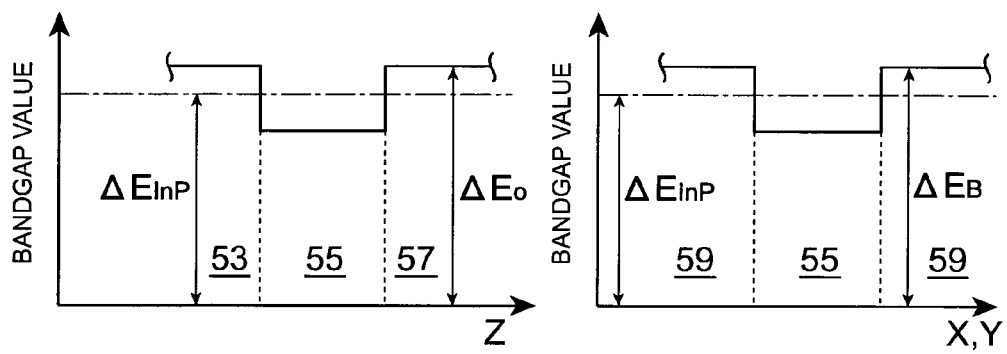
FIG. 7B is a diagram showing the band gap taken along the line VII-VII of FIG. 7A.
FIG. 7C is a diagram showing the band gap taken along the line VIII-VIII of FIG. 7A.
Figure 7D:
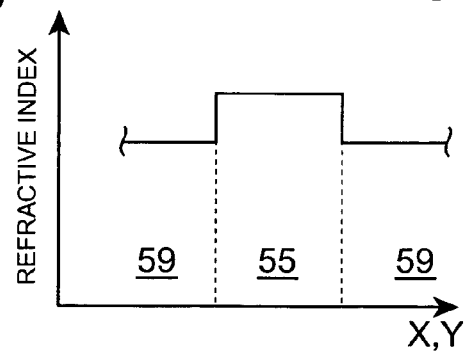
FIG. 7D is a diagram showing the refractive index taken along the line VIII-VIII of FIG. 7A.

FIG. 6 is a perspective view showing the surface emitting semiconductor device according to a second embodiment. XYZ-coordinate system S is shown in FIG. 6. FIG. 7A is a cross sectional view showing the surface emitting semiconductor device taken along the line VI-VI shown in FIG. 6. FIG. 7B is a diagram showing the band gap taken along the line VII-VII of FIG. 7A. FIG. 7C is a diagram showing the band gap taken along the line VIII-VIII of FIG. 7A. FIG. 7D is a diagram showing the refractive index taken along the line VIII-VIII of FIG. 7A. Referring to FIGS. 6 and 7A, a surface emitting semiconductor device 51, such as a buried heterostructure semiconductor laser device, is shown.

This semiconductor optical device 51 comprises a first DBR portion 52, a first conductivity type semiconductor region 53, a current block semiconductor region 59, a semiconductor mesa 63, and a second DBR portion 65. The first conductivity type semiconductor region 53 includes a primary surface having a first area 53a and a second area 53b, and is provided on a surface of GaAs semiconductor. The semiconductor mesa 63 includes an active layer 55 and a second conductive type semiconductor layer 57. The active layer 55 is provided on the first region 53a of the first conductivity type semiconductor region 53. The second conductivity type semiconductor layer 57 is provided on the active layer 55. The current block semiconductor region 59 is provided on the following regions: the second region 53b of the first conductivity type semiconductor region 53; the side surfaces 55a and 57a of the semiconductor mesa 63. The current block semiconductor region 59 confines current into the semiconductor mesa 63. The first DBR portion 52 has first semiconductor layers 52a and second semiconductor layers 52b, which are arranged alternately. The second DBR portion 65 has third semiconductor layers 65a and fourth semiconductor layers 65b, which are arranged alternately. The first conductive type semiconductor region 53 and the semiconductor mesa 63 are provided between the first DBR portion 52 and the second DBR portion 65. The active layer 55 is made of III-V compound semiconductor including at least nitrogen element as a V group member.

Accordingly, current flowing through the surface emitting semiconductor laser 51 is confined into the semiconductor mesa 63 on the first area 53a of the first conductive type semiconductor region 53 because the current block semiconductor region 59 is provided on the second area 53b thereof.

The surface emitting semiconductor device 51 does not have an insulative region, provided for confining the current, which is formed by implanting proton ions into a predetermined semiconductor region to modify it into insulative. In the surface emitting semiconductor device 51 effectively confines the current as compared to a surface emitting semiconductor device having an ion-implanted isolation region. Further, since the surface emitting semiconductor device 51 does not use the ion-implanted isolation region, the confinement of current is not degraded by the heating step in the manufacturing process.

The surface emitting semiconductor device 51 does not have an isolation region of $Al_2O_3$, provided for confining the current, which is formed by partially oxidizing an AlAs semiconductor layer to form a path flowing through the current. Since the surface emitting semiconductor device 51 has the current path that is defined by a photolithography step, the size of the current path can be easily controlled in the manufacturing process as compared to surface emitting semiconductor devices using the insulating region of $Al_2O_3$. Since the surface emitting semiconductor device 51 does not have an insulating region of $Al_2O_3$ formed by oxidizing the peripheral of the AlAs layer, thereby reducing the occurrence of the peeling of epitaxial layers due to the formation of the insulating region of $Al_2O_3$.

In the surface emitting semiconductor device 51, the active layer 55 made of a III-V compound semiconductor containing at least nitrogen element as a V group member can be provided on a GaAs substrate, whereby the first conductivity type semiconductor region 53, the second conductivity type semiconductor layer 57, and the current block semiconductor region 59 can be made of semiconductor material lattice-matched to GaAs semiconductor and having a band gap higher than that of InP semiconductor. The heterobarriers of the semiconductor regions surrounding the active layer in the surface emitting semiconductor device 51 can be made higher than that in InGaAsP/InP semiconductor optical devices.

The first conductivity type semiconductor region 53 is made of III-V compound semiconductor, and this III-V compound semiconductor has a photoluminescence wavelength value shorter than that of the active layer 55. The second conductivity type semiconductor layer 57 is made of III-V compound semiconductor, and this III-V compound semiconductor has a photoluminescence wavelength value shorter than that of the active layer 55. The photoluminescence wavelength value of the semiconductor material is equal to its wavelength value corresponding to its band gap energy. As shown in the band gap diagram of FIG. 7B, the first conductivity type semiconductor region 53 and the second conductivity type semiconductor layer 57 function to confine carriers into the active layer 55. Accordingly, the first conductivity type semiconductor region 53 functions as a cladding layer of the first conductivity type, whereas the second conductivity type semiconductor layer 57 functions as a cladding layer of the second conductivity type. The active layer 55 generates light in response to carriers confined therein and injected from the first conductivity type semiconductor region 53 and from the second conductivity type semiconductor layer 57. As shown in FIG. 7B, the surface emitting semiconductor device 51 has a cladding layer with a band gap value $\Delta E_0$ higher than the band gap value $\Delta E_{InP}$ of cladding layers made of InP semiconductor used in InP/InGaAsP surface emitting semiconductor devices. Thus, the carrier confinement in the surface emitting semiconductor device 51 in the z-direction is superior to the InP/InGaAsP surface emitting semiconductor devices.

The current block semiconductor region 59 is made of a III-V compound semiconductor, whereas this III-V compound semiconductor exhibits a photoluminescence wavelength value shorter than that of the active layer 55. As a result, as seen from the band gap diagram of FIG. 7C, the current block semiconductor region 59 function as a current blocker. As shown in FIG. 7D, the current block semiconductor region 9 has exhibiting a band gap value $\Delta E_B$ higher than the band gap value $\Delta E_{Inp}$ of the InP current block semiconductor layer in InP/InGaAsP surface emitting semiconductor devices. Thus, the surface emitting semiconductor device 51 in the x- and y-directions is superior to the InP/InGaAsP surface emitting semiconductor device in terms of carrier confinement.

The surface emitting semiconductor device 51 further comprises a semiconductor substrate 61. A GaAs semiconductor substrate is presented as an example of the semiconductor substrate 61. A GaAs semiconductor substrate provides a surface of GaAs semiconductor on which the first conductivity type semiconductor region 53 is formed. The first DBR portion 52 is provided on a primary surface 61a of the semiconductor substrate 61. The first conductivity type semiconductor region 53 is provided on the first DBR portion 52. The active layer 55 and the second conductivity type semiconductor layer 57 are surrounded by the current block semiconductor region 59, and are formed into the semiconductor mesa. The active layer 55 is provided between the second conductivity type semiconductor layer 57 and the first area 53a of the first conductivity type semiconductor region 53. The active layer 55 and the second conductivity type semiconductor layer 57 constitute the semiconductor mesa 63. In the semiconductor mesa 63, carriers are injected into the active layer 55 through the second conductivity type semiconductor layer 57 and through the first area 53a of the first conductivity type semiconductor region 53.

In the surface emitting semiconductor device 51, the first DBR portion 52 is provided on the semiconductor substrate 61. The first conductive type semiconductor region 53, the active layer 55, the second semiconductor layer 57, and the current block semiconductor region 59 is provided on the first DBR portion 52. The current block semiconductor region 59 surrounds the active layer 55 and the second semiconductor layer 57. Each of the first and second DBR portions functions as a Bragg reflector. For example, the refractive index of the first DBR semiconductor layer 52a is different from the refractive index of the second DBR semiconductor layer 52b, and the first DBR portion 52 exhibits an optical spectrum relating to the thickness of the first DBR semiconductor layer 52a and the second DBR semiconductor layer 52b. This optical spectrum enables the first DBR portion 52 to reflect a part of light having wavelength components generated by the active layer 55 and to filter out another part of the light.

The semiconductor device 51 further comprises a second conductivity type semiconductor layer 67, and electrodes 71 and 73. The second conductivity type semiconductor layer 67 is provided on the second conductivity type semiconductor layer 65. The electrode 71 is provided on the second conductivity type semiconductor layer 67. The electrode 73 is provided on the rear side 61b of the substrate 61. An opening is formed in at least one of the electrodes 71 and 73 to avoid blocking light from the semiconductor mesa 63. In the present embodiment, the electrode 71 has an opening 71a which is positioned to the semiconductor mesa 63.

In the surface emitting semiconductor device 51, the current block semiconductor region 59 has a first current block layer 59a and a second current block layer 59b. The conductivity type of the first current block layer 59a is different from that of the second current block layer 59b. The current block semiconductor region 59 includes a p-n junction constituted by the first and second current block layers 59a and 59b. This p-n junction functions to block the currents.

In the surface emitting semiconductor device 51, the first current block layer 59a may be made of semiconductor material of the second conductivity type, and the second current block layer 59b may be made of semiconductor material of the first conductivity type. The first current block layer 59a is provided between the first conductivity type semiconductor region 53 and the second current block layer 59b of the first conductivity type semiconductor, whereas the second current block layer 59b is provided between the second DBR portion 65 of the second conductive type and the first current block layer 59a of the second conductivity type semiconductor. Hence, the DBR portion 65, the first conductivity type semiconductor region 53, and the current block semiconductor region 59 constructs a p-n-p-n or n-p-n-p structure.

A first example of the surface emitting semiconductor device 51 is as follows:
the first DBR portion 52:
the first DBR semiconductor layer: n-type AlGaAs;
the second DBR semiconductor layer: n-type GaAs;
the first conductivity type semiconductor region 53:
n-type AlGaInP semiconductor and/or n-type GaInP semiconductor;
the active layer 55: un-GaInNAs semiconductor, un-GaNAs semiconductor, un-GaNAsSb semiconductor, un-GaNAsP semiconductor, un-GaNAsSbP semiconductor, un-GaInNAsSb semiconductor, un-GaInNAsP semiconductor, and/or un-GaInNAsSbP semiconductor;
the second conductivity type semiconductor layer 57: p-type AlGaInP semiconductor and/or p-type GaInP semiconductor;
the second DBR portion 65:
the third DBR semiconductor layer: p-type AlGaAs;
the fourth DBR semiconductor layer: p-type GaAs;
the first current block layer 59a: p-type AlGaInP semiconductor, p-type AlGaAs semiconductor, p-type GaAs semiconductor, and/or p-type GaInP semiconductor;
the second current block layer 59b: n-type AlGaInP semiconductor, n-type GaInP semiconductor, n-type AlGaAs semiconductor, and/or n-type GaAs semiconductor;
the substrate 61: heavily doped n-type GaAs substrate; and
the contact layer 67: p-type GaAs semiconductor.

In the surface emitting semiconductor device 51, the first conductivity type semiconductor region 53 and the second conductivity type semiconductor layer 57 may be made of an $(Al_xGa_{1-x})_yIn_{1-y}P$ semiconductor that is lattice-matched to GaAs semiconductor, whereas each of the first and second current block layers 59a and 59b may be made of an $Al_xGa_{1-x}As$ semiconductor and/or an $(Al_xGa_{1-x})_yIn_{1-y}P$ semiconductor that is lattice-matched to GaAs semiconductor. In these semiconductor crystals, composition "X" has a value within the range of zero or greater but not greater than 1. Using this semiconductor material improves the carrier confinement in the following arrangements: between the active layer 55 and the current block semiconductor region 59; between the active layer 55 and the first conductivity type semiconductor region 53; and between the active layer 55 and the second conductivity type semiconductor layer 57.

A second example of the surface emitting semiconductor device 51 is as follows:
the first DBR portion 52:
the first DBR semiconductor layer: n-type AlGaAs;
the second DBR semiconductor layer: n-type GaAs;
the first conductivity type semiconductor region 53: n-type AlGaAs semiconductor and/or n-type GaAs semiconductor;
the active layer 55: un-GaInNAs semiconductor, un-GaNAs semiconductor, un-GaNAsSb semiconductor, un-GaNAsP semiconductor, un-GaNAsSbP semiconductor, un-GaInNAsSb semiconductor, un-GaInNAsP semiconductor, and/or un-GaInNAsSbP semiconductor;
the second conductivity type semiconductor layer 57: p-type AlGaAs semiconductor and/or p-type GaAs semiconductor;
the second DBR portion 65:
the third DBR semiconductor layer: p-type AlGaAs;
the fourth DBR semiconductor layer: p-type GaAs;
the first current block semiconductor layer 59a: p-type AlGaInP semiconductor, p-type AlGaAs semiconductor, p-type GaAs semiconductor, and/or p-type GaInP semiconductor;
the second current block semiconductor layer 59b: n-type AlGaInP semiconductor, n-type GaInP semiconductor, n-type AlGaAs semiconductor, and/or n-type GaAs semiconductor;
the substrate 61: heavily-doped n-type GaAs substrate; and
the contact layer 67: p-type GaAs semiconductor.

In the surface emitting semiconductor device 51, the first conductivity type semiconductor region 53 and the second conductivity type semiconductor layer 57 may be made of an $Al_xGa_{1-x}As$ semiconductor, whereas each of the first and second current block layers 59a and 59b may be made of an $Al_xGa_{1-x}As$ semiconductor and/or an $(Al_xGa_{1-x})_yIn_{1-y}P$ semiconductor that is lattice-matched to GaAs semiconductor. In these semiconductor crystals, composition "X" has a value within the range of zero or greater but not greater than 1. Using these semiconductor materials improves the carrier confinement in the following arrangements: between the active layer 55 and the current block semiconductor regions 59; and between the active layer 55 and the first conductivity type semiconductor region 53; and between the active layer 55 and the second conductivity type semiconductor layer 57.

Therefore, the carrier confinement in both transverse lateral and transverse vertical directions is enhanced in the surface emitting semiconductor device 51, whereby the surface emitting semiconductor device 51 exhibits a low threshold current, a high slope efficiency, and an improved temperature characteristic as compared to InP/GaInAsP semiconductors semiconductor laser devices.

In the surface emitting semiconductor device 51 made of the above-mentioned semiconductor materials, the active layer 55 is suitable for generating light having a wavelength of 0.9 micrometers or longer.

As shown in FIG. 7B, InP semiconductor has the band gap $\Delta E_{InP}$ and the cladding layers have band gap $\Delta E_0$. As can be seen from FIG. 7B, the band gap $\Delta E_0$ is greater than the band gap $\Delta E_{InP}$. That is, the band gap difference between the active layer (made of one of GaInNAs, GaNAs, GaNAsSb, GaNAsP, GaNAsSbP, GaInNAsSb, GaInNAsP, and GaInNAsSbP semiconductors) and the cladding layer (p-type AlGaInP, n-type AlGaInP, p-type AlGaAs, or n-type AlGaAs semiconductor) can be made greater than the band gap difference of a heterojunction between InP semiconductor (having a band gap energy of $2.16 \times 10^{-19}$ joules (1.35 eV)) and GaInAsP semiconductor. As seen from FIG. 7C, this explanation similarly applies to the active layer 55 and the current block semiconductor region 59.

Figure 8A:
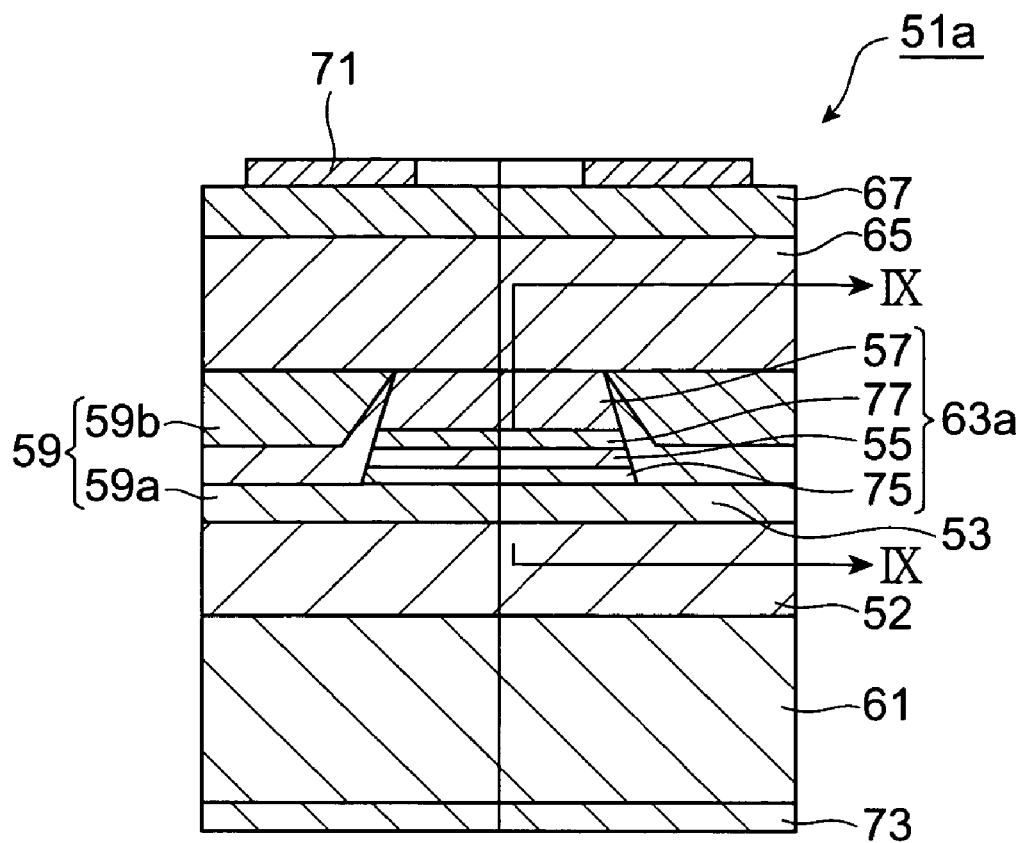
FIG. 8A is a cross sectional view showing a modified surface emitting semiconductor device in accordance with the second embodiment.
Figure 8B:
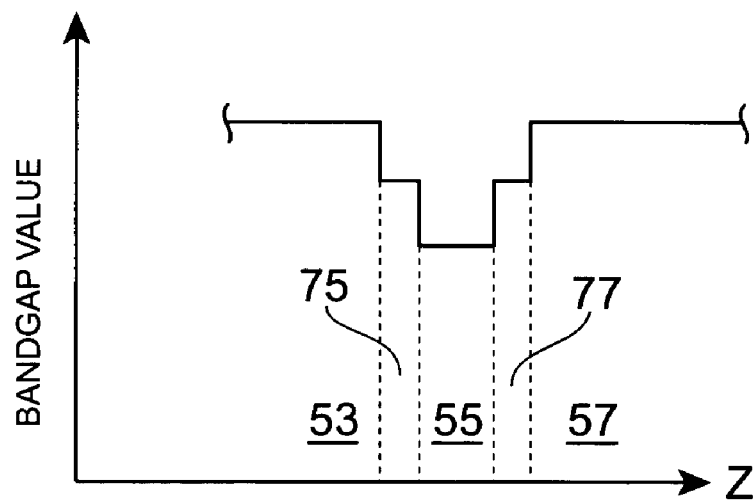
FIG. 8B is a diagram showing the band gap taken along the line IX-IX of FIG. 8A.

FIG. 8A is a cross sectional view showing a modified surface emitting semiconductor device in accordance with the second embodiment. FIG. 8B is a diagram showing the band gap taken along the line IX-IX of FIG. 8A. The surface emitting semiconductor device 51a may further comprise a first SCH layer 75 and a second SCH layer 77. The first SCH layer 75 is provided between the first conductivity type semiconductor region 53 and the active layer 55. The second SCH layer 77 is provided between the active layer 55 and the second conductivity type semiconductor layer 57. The first and second SCH layers 75 and 77 are surrounded by the current block region 59. The first conductivity type semiconductor region 53, the active layer 55, the second conductivity type semiconductor layer 57, and the first and second SCH layers 75 and 77 constitute a semiconductor mesa 63a.

The first SCH layer 75 exhibits a photoluminescence wavelength value between that of the active layer 55 and that of the first conductivity type semiconductor region 53. The second SCH layer 77 exhibits a photoluminescence wavelength value between that of the active layer 55 and that of the second conductivity type semiconductor layer 57. Carriers are injected into the active layer 55 from the first region 53a of the first conductivity type semiconductor region 53 and from the second conductivity type semiconductor layer 57 by way of the first and second SCH layers 75 and 77, respectively. As shown in FIG. 8B, the first and second SCH layers 75 and 77 function to confine the injected carriers into the active layer 55 in the surface emitting semiconductor device 51a.

The first and second SCH layers 75 and 77 may be made of an $Al_xGa_{1-x}As$ semiconductor ($0 \leq X \leq 1$) or a $Ga_xIn_{1-x}As_yP_{1-y}$ semiconductor (about $0.5 \leq X \leq 1$, $0 \leq Y \leq 1$) that is lattice-matched to GaAs semiconductor. An example of the surface emitting semiconductor device 51a is as follows:
the SCH semiconductor layers 75 and 77: un-$Al_xGa_{1-x}As$ ($0 \leq X \leq 1$), un-GaAs, and/or a $Ga_xIn_{1-x}As_yP_{1-y}$ semiconductor (about $0.5 \leq X \leq 1$, $0 \leq Y \leq 1$) lattice-matched to GaAs semiconductor.

If these materials are used, the photoluminescence wavelengths of the first and second SCH semiconductor layers 75 and 77 are between photoluminescence wavelengths of the first conductivity type semiconductor region 53 and second conductivity type semiconductor layer 57 and the photoluminescence wavelength of the active layer 55, thereby realizing excellent carrier confinement into the active layer 55. In the preferred example, semiconductor InGaAsP is lattice-matched to GaAs semiconductor.

Figure 9A:
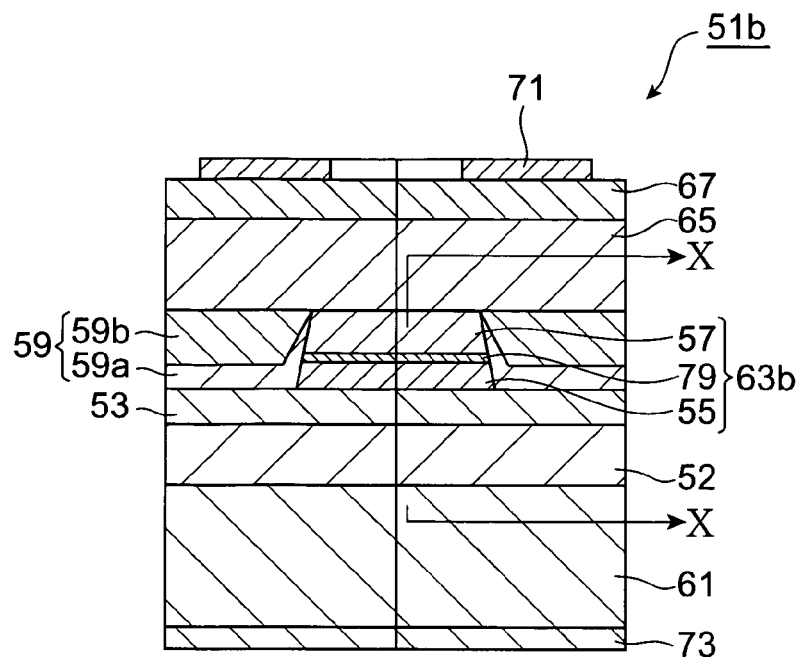
FIG. 9A is a cross sectional view showing a modified surface emitting semiconductor device in accordance with the second embodiment.
Figure 9B:
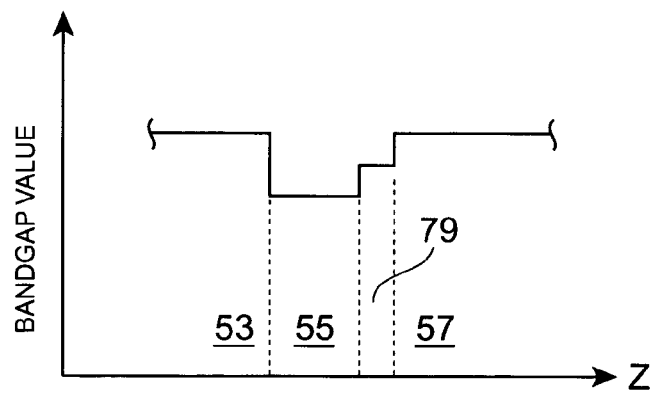
FIG. 9B is a diagram showing the band gap taken along the line X-X of FIG. 9A.
Figure 9C:
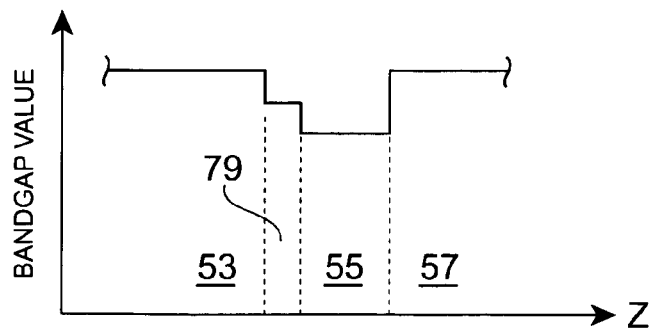
FIG. 9C is a diagram showing the band gap of the surface emitting semiconductor device taken along a line equivalent to the line X-X of FIG. 9A.

FIG. 9A is a cross sectional view showing a modified surface emitting semiconductor device in accordance with the present embodiment. FIG. 9B is a diagram showing the band gap taken along the line X-X of FIG. 9A. FIG. 9C is a diagram showing the band gap taken along a line equivalent to the line X-X of FIG. 9A. The surface emitting semiconductor device 51b may further comprise an additional semiconductor layer 79 made of a III-V compound semiconductor. In the surface emitting semiconductor device 51b, the additional semiconductor layer 79 is provided between the second conductivity type semiconductor layer 57 and the active layer 55. The III-V compound semiconductor of the additional semiconductor layer 79 exhibits a photoluminescence wavelength value between that of the active layer 55 and that of the second conductivity type semiconductor layer 57. The active layer 55, the second conductivity type semiconductor layer 57, and the additional semiconductor layer 79 constitute a semiconductor mesa 63b.

In FIG. 9A, the surface emitting semiconductor device 51b has the additional semiconductor layer 79 provided between the second conductivity type semiconductor layer 57 and the active layer 55, but it may be provided between the first conductivity type semiconductor region 53 and the active layer 55 as shown in FIG. 9C. If the additional semiconductor layer 79 is provided between the first conductivity type semiconductor region 53 and the active layer 55, the III-V compound semiconductor of the additional semiconductor layer 79 exhibits a photoluminescence wavelength value between that of the first conductivity type semiconductor region 53 and that of the active layer 55. Additional semiconductor layers may be provided on both sides of the active layer 55 as well. That is, the additional semiconductor layer 79 may be provided in at least one of following interfaces: between the first conductivity type semiconductor region 53 and the active layer 55; and between the second conductivity type semiconductor layer 57 and the active layer 55.

The above relationship of photoluminescence wavelengths enables the additional semiconductor layer 79 to lower a spike or a notch in at least one of the following arrangements: between the active layer 55 and the first conductivity type semiconductor region 53; and between the active layer 55 and the second conductivity type semiconductor layer 57. Therefore, the heterobarriers at those interfaces are alleviated.

An example of the surface emitting semiconductor device 51b are shown below:

the semiconductor layer 79: p-type AlGaAs, p-type AlGaInP, p-type GaInP, and/or p-type GaInAsP semiconductor.

Figure 10:
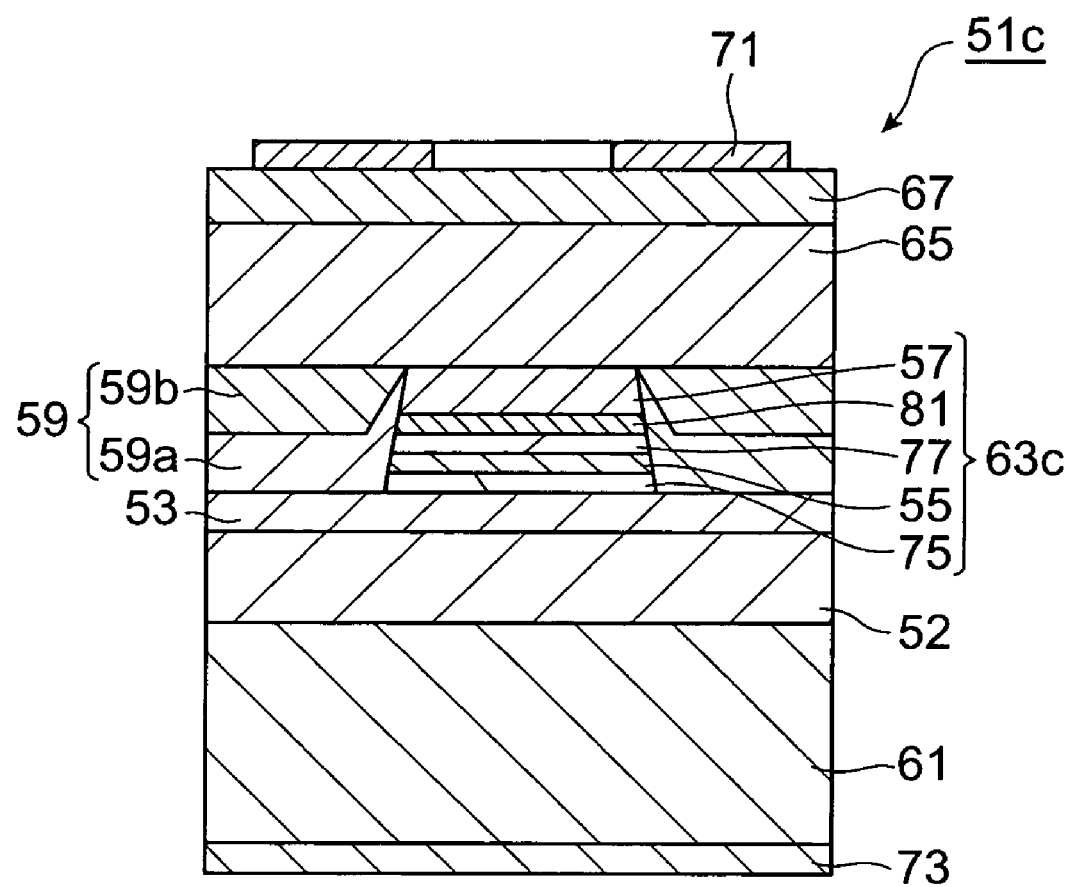
FIG. 10 is a cross sectional view showing a modified example of the surface emitting semiconductor device in accordance with the second embodiment.

FIG. 10 is a cross sectional view showing a modified surface emitting semiconductor device in accordance with the present embodiment. The surface emitting semiconductor device 51c including SCH layers 75 and 77 may further include an additional semiconductor layer 81 made of a III-V compound semiconductor. The additional semiconductor layer 81 is provided in at least one of following interfaces: between the first conductivity type semiconductor region 53 and the first SCH layer 75; between the second conductivity type semiconductor layer 57 and the second SCH layer 77. If the additional semiconductor layer 81 is provided between the second conductivity type semiconductor layer 57 and the second SCH layer 77 as in the surface emitting semiconductor device 51c shown in FIG. 10A, the III-V compound semiconductor of the additional semiconductor layer 81 exhibits a photoluminescence wavelength value between that of the second SCH layer 77 and that of the second conductivity type semiconductor layer 57. If the additional semiconductor layer 81 is provided between the first conductivity type semiconductor region 53 and the first SCH layer 75, the III-V compound semiconductor of the additional semiconductor layer 81 has a photoluminescence wavelength value between that of the first SCH layer 75 and that of the first conductivity type semiconductor region 53. The active layer 55, the second conductivity type semiconductor layer 57, the first and second SCH layers 75 and 77, and the additional semiconductor layer 81 constitute a semiconductor mesa 63c. The semiconductor layer 81 of the surface emitting semiconductor device Sic can be made of the same material as the semiconductor layer 79.

The above photoluminescence wavelength relationship enables the additional semiconductor layer 81 to lower a spike or a notch at the following heterojunction interfaces: between the SCH layer 75 and the first conductivity type semiconductor region 53; between the SCH layer 77 and the second conductivity type semiconductor layer 57. The heterobarriers at these interfaces are thereby alleviated.

As described above, the surface emitting semiconductor device according to the present invention realizes excellent current confinement.

Figure 11A:
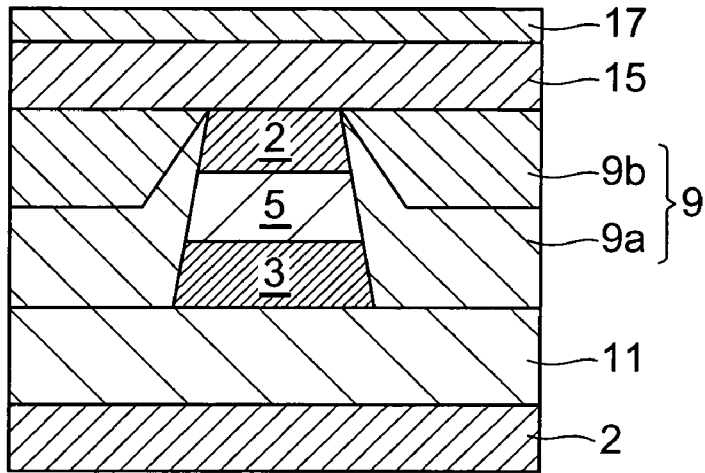
FIGS. 11A and 11B show modified surface emitting semiconductor optical devices.
Figure 11B:
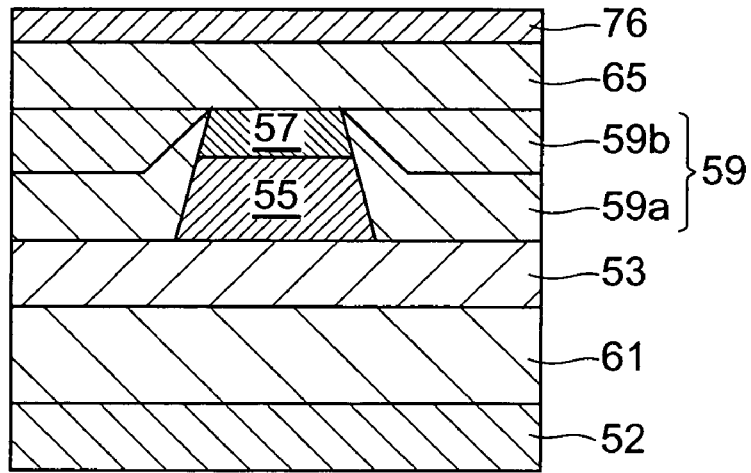

The first and second embodiments of the present invention are described with reference to a number of modified examples in the foregoing. FIGS. 11A and 11B show modified surface emitting semiconductor devices according to the present invention. Although the first DBR portion 2 (the second DBR portion 52) is provided between the substrate 11 (61) and the active layer 5 (55) in the first embodiment (the second embodiment), the substrate 11 is provided between the first DBR portion 2 and the active layer 5 in the modified surface emitting semiconductor device as shown in FIG. 11A. Further, the substrate 61 is provided between the first DBR 52 and the active layer 55 as shown in FIG. 11B.

Although the first and second embodiments of the present invention are described with reference to a number of modified examples in the foregoing, the embodiments are not limited thereto. In the surface emitting semiconductor device in accordance with a further modified example, each of the first and second current block semiconductor layers are made of a III-V compound semiconductor including no aluminum (Al) as a III group element. If first and second current block layers are made of semiconductor materials containing Al element, Al atoms in these layers may be gradually oxidized with time around the interface between an active layer and a current block semiconductor region, thereby increasing the number of non-radiative recombination centers. If the first and second current block layers do not contain Al as a III group element, the occurrence of Al oxidization that deteriorates the characteristics and reliability of the surface emitting semiconductor device is reduced. A GaInP semiconductor can be presented as an example of III-V compound semiconductor that contains no Al as a III group element. In a preferred example, the GaInP semiconductor is lattice-matched to GaAs semiconductor.

If a III-V semiconductor material containing Al is used for a current block semiconductor region, Al oxidization may occur in the step of burying the semiconductor mesa at the following interfaces: between the current block semiconductor region and the semiconductor mesa; and/or between the current block semiconductor region and a first conductivity type semiconductor region. Thus, the current block semiconductor region with a favorable crystal quality cannot be provided due to the Al oxidization. For example, GaInP semiconductors do not contain Al, and thus do not incur such a problem coming from the Al oxidization. The band gap of GaInP semiconductors is greater than that of III-V semiconductors including nitrogen (N). The current block semiconductor region made of a GaInP semiconductor favorably confines carriers into an active layer. Further, the refractive index of GaInP semiconductors is lower than that of III-V semiconductors including nitrogen (N). The current block semiconductor region made of a GaInP semiconductor favorably confines light into an active layer in the lateral transverse direction.

The current block semiconductor region is made of a GaInP semiconductor, the active layer may be made of semiconductor material that contains no aluminum (Al) as a III group element, and the first conductivity type semiconductor region and the second conductivity type semiconductor layer may be made of a GaInP semiconductor. In this semiconductor surface emitting device, the emission characteristic of the active layer is not deteriorated because of Al oxidization, and the crystal quality of the current block semiconductor region is not degraded by Al oxidization occurring in the burying step. If the second conductivity type semiconductor layer and the current block semiconductor region are made of materials that does not contain aluminum (Al) as a III group element, an additional second conductivity type semiconductor layer can be grown on the current block semiconductor region and the second conductivity type semiconductor layer without the degradation of crystal quality caused by Al oxidization. Thus, the buried heterostructure type surface emitting semiconductor device has high performances and high reliability.

In the surface emitting semiconductor device having a light-generating region containing a heterobarrier alleviating layer made of a GaInAsP semiconductor and an active layer made of III-V semiconductor including no aluminum as a III group element, the first conductivity type semiconductor region, the second conductivity type semiconductor layer, and the current block semiconductor region may be made of GaInP semiconductor. In a preferred example, GaInP semiconductor lattice-matched to GaAs semiconductor is used. Semiconductor layers constituting the surface emitting semiconductor device are made of semiconductors without Al acting as a III group member, so that the occurrence of degradation of the reliability and the emission characteristics due to the Al oxidization is reduced.

In the surface emitting semiconductor device having an SCH layer and a light-emitting region including an active layer made of III-V semiconductor containing no Al as a III group member, for example, the SCH layer may be made of at least one of GaAs and GaInAsP semiconductors, whereas the first conductivity type semiconductor region, second conductivity type semiconductor layer and the current block semiconductor region may be made of a GaInP semiconductor. In a preferred example, GaInP and GaInAsP semiconductors lattice-matched to GaAs semiconductor can be used. Since the semiconductor layers constituting the surface emitting semiconductor device contains substantially no Al, the reliability and emission characteristics of the surface emitting semiconductor device is not degraded due to the Al oxidization.

In the surface emitting semiconductor device having a light emitting region including SCH layers and an active layer that are made of III-V semiconductor without Al as a III group element, for example, the SCH layer may be made of at least one of GaAs and GaInAsP semiconductors. Further, the heterobarrier alleviating layer may be made of a GaInAsP semiconductor. Furthermore, the first conductivity type semiconductor region, the second conductivity type semiconductor layer and the current block semiconductor region may be made of a GaInP semiconductor. In a preferred example, GaInP and GaInAsP semiconductors lattice-matched to GaAs semiconductor can be used. Since the semiconductor layers constituting the surface emitting semiconductor device are made of semiconductors without Al acting as a III group member, the reliability and emission characteristics of the surface emitting semiconductor device is not degraded because of the Al oxidization.

In the foregoing, the surface emitting semiconductor device including a semiconductor light-emitting element, such as a laser diode, is described in the first and second embodiments, but surface emitting semiconductor devices are not limited to specific surface emitting semiconductor devices as in the first and second embodiments. The surface emitting semiconductor device may include any of a semiconductor laser diode and a semiconductor optical amplifier. Furthermore, the surface emitting semiconductor device may be an optical integrated device composed of a plurality of components, such as a semiconductor laser diode and a semiconductor optical amplifier.

The structures disclosed in the embodiments make it possible to enhance the confinement of carriers in any of the semiconductor laser, semiconductor optical amplifier and the optical integrated device by use of semiconductor material having a band gap higher than that of InP semiconductor, thereby improving their temperature characteristics as compared with InGaAsP/InP semiconductor optical devices.

Preferably, III-V compound semiconductor of the active layer in the first and second embodiments includes at least gallium element (Ga) as a III group member, and at least arsenic element (As) and nitrogen element (N) as V group members. The lattice constant of this material can be made equal or close to that of a GaAs semiconductor, so that the active layer can be grown on the GaAs semiconductor.

In the surface emitting semiconductor devices 1 and 51, the band gap energy difference at heterojunctions of the following arrangements are larger than those of the InP/InGaAsP semiconductors: between the active layer and the second conductivity type semiconductor layer; between the active layer and the first conductivity type semiconductor region; between the active layer and the first current block layer; and between the active layer and the second current block layer. Therefore, the structures of the surface emitting semiconductor devices 1 and 51 can improve the carrier confinement into the active layer.

In the surface emitting semiconductor devices in accordance with the present embodiments, III-V compound semiconductor containing nitrogen element (N) can be used in the active layer. For example, one candidate of the III-V compound semiconductor containing nitrogen element (N) is a III-V compound semiconductor including at least nitrogen (N), gallium (Ga) and arsenic (As). Since this III-V semiconductor has a lattice constant equal or close to that of GaAs. Therefore, the III-V compound semiconductor crystal can favorably be grown on a GaAs semiconductor surface. The III-V compound semiconductor containing at least nitrogen element (N), gallium (Ga), and arsenic (As) has a band gap corresponding to a wavelength band of 0.9 micrometers or longer. Hence, using this III-V compound semiconductor for the active layer can realize surface emitting semiconductor devices that generate light having a wavelength of 0.9 micrometers or longer, e.g., light sources for 1.3-micrometer band optical communication or light sources for 1.55-micrometer band optical communication.

GaInAs and GaInAsP semiconductor crystals can be grown on a GaAs substrate to form the active layer of the surface emitting semiconductor device. But, the difference between the lattice constants of these crystals and the lattice constant of GaAs becomes too large in an oscillation wavelength of 1 micrometer or longer, whereby excessive strain occur in the crystal of the active layer. The excessive strain may cause the quality of the crystal to deteriorate. Therefore, the optical semiconductor device cannot attain favorable oscillation characteristics and reliability. By contrast, a III-V compound semiconductor containing at least nitrogen, gallium, and arsenic has a lattice constant equal or close to that of the GaAs semiconductor, and thus is free of excessive crystal strains, so that better oscillation characteristics and reliability can be realized in the surface emitting semiconductor device without structural limitations even in the surface emitting semiconductor devices that generate light of an oscillation wavelength of 1 micrometer or longer.

Examples of the III-V compound semiconductor containing at least nitrogen, gallium, and arsenic are GaNAs and GaInNAs semiconductors. These semiconductors are new materials that have recently been developed. Their compositions of constituent elements (Ga, In, N, As) can be adjusted so as to obtain the following semiconductor material: semiconductor material lattice-matched to GaAs semiconductor; semiconductor material having a lattice constant close to that of GaAs semiconductor (with a lattice mismatch within ±2 percent); and semiconductor material for generating light having a wavelength of 0.9 micrometers or longer. Therefore, a long wavelength surface emitting semiconductor device can be realized on a GaAs semiconductor layer or GaAs substrate.

Antimony (Sb) and/or phosphorus (P) can be added as a V group member to GaNAs semiconductors and GaInNAs semiconductors. Antimony, acting as a so-called surfactant, can prevent the three-dimensional crystal growth of GaInNAs semiconductors, thereby being effective in the improvement of the crystal quality of GaNAs and GaInNAs semiconductors. Phosphorus is effective in the reduction of the local crystal strains in GaNAs and GaInNAs semiconductors and effective in the increase of the number of nitrogen atoms taken into crystals as a V group element. GaInNAsP semiconductors are advantageous in that it does not have a miscibility gap in the phase diagram.

The surface emitting semiconductor devices in accordance with the first and second embodiments may include a cladding layer made of an $Al_xGa_{1-x}As$ semiconductor ($0 \leq X \leq 1$) and/or an $(Al_xGa_{1-x})_yIn_{1-y}P$ semiconductor ($0 \leq X \leq 1$) that is lattice-matched to GaAs semiconductor. Using these materials can improve the confinement of carriers. Among semiconductor materials in InP/InGaAsP long-wavelength semiconductor lasers, InP semiconductor exhibits the largest band gap of $2.16 \times 10^{-19}$ joules (1.35 eV). If a cladding layer is made of InP semiconductor in these semiconductor lasers, the band gap difference between the cladding layer and the active layer cannot be made large and thus the carrier confinement cannot be improved.

The $(Al_xGa_{1-x})_yIn_{1-y}P$ semiconductor ($0 \leq X \leq 1$) lattice-matched to GaAs semiconductor has a band gap value within the range of $3.06 \times 10^{-19}$ joules (1.91 eV) or greater but not greater than $3.92 \times 10^{-19}$ joules (2.45 eV) as the composition X of Al changes. The $Al_xGa_{1-x}As$ semiconductor ($0 \leq X \leq 1$) has a band gap value within the range of $2.27 \times 10^{-19}$ joules (1.42 eV) or greater but not greater than $3.19 \times 10^{-19}$ joules (1.99 eV) as the composition X of Al changes. Accordingly, the band gap difference between the cladding layer and the active layer is made greater than that in InP/GaInAsP semiconductor laser, and the confinement of carriers into the active layer can be improved. Therefore, the temperature characteristic of the surface emitting semiconductor device can be improved.

The active layer may be made of at least one of the following semiconductor material: GaInNAs; GaNAs; GaNAsSb; GaNAsP; GaNAsSbP; GaInNAsSb; GaInNAsP; and GaInNAsSbP semiconductors. The cladding layer may be made of an $(Al_xGa_{1-x})_yIn_{1-y}P$ semiconductor ($0 \leq X \leq 1$) or an $Al_xGa_{1-x}As$ semiconductor ($0 \leq X \leq 1$). Since a surface emitting semiconductor device which generates light of the oscillation wavelength of 1.3 micrometer band has an active layer of a band gap of about $1.53 \times 10^{-19}$ joules (0.954 eV), the band gap difference between the active layer and the cladding layer of the AlGaInP semiconductor is $1.53 \times 10^{-19}$ joules (0.956 eV) at the minimum and $2.4 \times 10^{-19}$ joules (1.496 eV) at the maximum, and the band gap difference between the active layer and the cladding layer of AlGaAs semiconductor is $0.75 \times 10^{-19}$ joules (0.466 eV) at the minimum and $1.66 \times 10^{-19}$ joules (1.036 eV) at the maximum.

Since a surface emitting semiconductor device which generates light of the oscillation wavelength of 1.55 micrometer band includes the active layer having a band gap of about $1.28 \times 10^{-19}$ joules (0.8 eV), the band gap difference between the active layer and the cladding layer of AlGaInP semiconductor is $1.78 \times 10^{-19}$ joules (1.11 eV) at the minimum and $2.64 \times 10^{-19}$ joules (1.65 eV) at the maximum, and the band gap difference between the active layer and the cladding layer of AlGaAs semiconductor is $0.99 \times 10^{-19}$ joules (0.62 eV) at the minimum and $1.91 \times 10^{-19}$ joules (1.19 eV) at the maximum.

The band gaps of $Al_xGa_{1-x}As$ semiconductor ($0 \leq X \leq 1$) and $(Al_xGa_{1-x})_yIn_{1-y}P$ semiconductor ($0 \leq X \leq 1$) lattice-matched to GaAs semiconductor increase and the refractive indices thereof decreases as their aluminum compositions increase. If the cladding layer and the current block layer are made of semiconductor material with a relatively smaller aluminum composition and semiconductor material with a relatively larger aluminum composition, respectively, the cladding layer has a refractive index higher than the refractive indices of the current block layers. Therefore, the effective refractive index of a mesa region surrounded by the current block layers can be made higher than that of the current block layers, and serves to stabilize a fundamental lateral transverse mode.

If the current block semiconductor region is made of $(Al_xGa_{1-x})_yIn_{1-y}P$ semiconductor ($0 \leq X \leq 1$) and/or $Al_xGa_{1-x}As$ semiconductor ($0 \leq X \leq 1$) which has a band gap greater than that of InP semiconductor, the heterobarrier between the active layer and the current block semiconductor region can be made greater, and thus the confinement of carriers into the active layer is further enhanced. As compared with InP/GaInAsP buried heterostructure semiconductor lasers, the semiconductor laser according to the present embodiments has the following advantages: the threshold current is lowered; the slope efficiency is increased; and the temperature characteristic is further improved.

In the surface emitting semiconductor devices 1 and 51, the active layer may have a quantum well structure. For example, the quantum well structure may be one of SQW and MQW structures, but the structure of the active layer is not limited thereto. For example, a well layer can be made of the same material as that of the active layer, whereas a barrier layer can be made of the same material as that of the SCH layers, such as AlGaAs, GaAs, or GaInAsP semiconductor.

The active layer has multiplayer structure including quantum well layers and barrier layers. Performances of the surface emitting semiconductor devices 1 and 51 are improved by using quantum well layers to which compressive stresses are applied or using quantum well layers and barrier layers to which stresses are applied in the opposite direction. The quantum well layers are made of following semiconductor material having a lattice constant greater than GaAs of the substrate: GaInNAs semiconductor; GaNAsSb semiconductor; GaNAsSbP semiconductor; and GaInNAsSb semiconductor. The barrier layers are made of following semiconductor material having a lattice constant smaller than GaAs of the substrate: GaNAs semiconductor; GaAsP semiconductor; GaInAsP semiconductor; and AlGaInAsP semiconductor.

In the surface emitting semiconductor devices according to the first and second embodiments, the SCH layers are made of material having a refractive index between that of the active layer and that of the cladding layer. In order to achieve the favorable confinement of carriers into the active layer, the SCH layers are made of material exhibiting a photoluminescence wavelength between that of the active layer and that of the cladding layer. In order to realize the above surface emitting semiconductor devices, the following combination can be used: the cladding layer made of $(Al_XGa_{1-X})_YIn_{1-Y}P$ semiconductor ($0 \leq X \leq 1$) and/or $Al_XGa_{1-X}As$ semiconductor ($0 \leq X \leq 1$) and the SCH layers made of $Al_XGa_{1-X}As$ semiconductor ($0 \leq X \leq 1$) and/or GaInAsP semiconductor lattice-matched to GaAs semiconductor. In particular, the SCH layers works effectively if the active layer has a quantum well structure constituted by very thin films.

The surface emitting semiconductor devices in accordance with the first and second embodiments may have a heterobarrier alleviating layer provided between the cladding layer and the SCH layer and/or between the cladding layer the active layer. A heterobarrier is produced at the heterostructure interface between the following layers: the cladding layer and the active layer; and the SCH layer and the cladding layer. The height of the heterobarrier depends on the band gap difference between the semiconductor materials thereof. This heterobarrier is known as a spike or notch, and has a wedge shape in an energy band diagram. This heterobarrier works as a barrier ΔEc for electrons in a conduction band and causes electric resistance thereto, and works as a barrier ΔEv for holes in a valence band and causes electric resistance thereto. The combination of an $(Al_XGa_{1-X})_YIn_{1-Y}P$ cladding layer and a GaAs SCH layer forms a p-n junction having a large heterobarrier in the valence band, for example. This heterobarrier increases the electric resistance in the surface emitting semiconductor devices, thereby generating great heat in the surface emitting semiconductor device. Further, this heterobarrier degrades the efficiency of carrier injection into the active layer. In particular, majority carriers in p-type semiconductors are holes, which exhibit low mobility due to their large effective mass. Therefore, they tends to be trapped at the heterobarrier, which results in a low efficiency of hole injection into the active layer. Hence, the large heterobarrier may be one of causes that degrade the long-term reliability and high output characteristic of the surface emitting semiconductor devices, for example. Lowering the heterobarrier is important to produce a surface emitting semiconductor device with the improved device characteristics and long-term reliability. The heterobarrier alleviating layer is useful for lowering the heterobarrier.

The following material can be used for the heterobarrier alleviating layer: $(Al_XGa_{1-X})_YIn_{1-Y}P$ semiconductor ($0 \leq X \leq 1$); $Al_XGa_{1-X}As$ semiconductor ($0 \leq X \leq 1$); and $Ga_XIn_{1-X}As_YP_{1-Y}$ semiconductor, for example. These semiconductors can be used in the surface emitting semiconductor device according to the embodiments having a cladding layer made of $(Al_XGa_{1-X})_YIn_{1-Y}P$ semiconductor ($0 \leq X \leq 1$) and/or $Al_XGa_{1-X}As$ semiconductor ($0 \leq X \leq 1$), and an SCH layer made of $Al_XGa_{1-X}As$ semiconductor ($0 \leq X \leq 1$) and/or $Ga_XIn_{1-X}As_YP_{1-Y}$ semiconductor (about $0.5 \leq X \leq 1$, $0 \leq Y \leq 1$) lattice-matched to GaAs semiconductor.

The material of the heterobarrier alleviating layer may have a composition attaining a lattice mismatch in a range of −2 percent or more but not greater than +2 percent with respect to the lattice constant of a semiconductor substrate. In general, the heterobarrier alleviating layer has a thickness smaller than its critical film thickness. The film thickness of the heterobarrier alleviating layer is, for example, in a range of 5 nanometers or more but not greater than 10 nanometers, preferably 5 nanometers. If the film thickness falls within this range, the occurrence of crystal defects is reduced. Since the range of lattice mismatch is widened as above, the available range of the composition of semiconductor material is expanded. If the cladding layer is made of $Al_XGa_{1-X}As$ semiconductor ($0 \leq X \leq 1$) or $(Al_XGa_{1-X})_YIn_{1-Y}P$ semiconductor ($0 \leq X \leq 1$) lattice-matched to GaAs semiconductor and the SCH semiconductor layer is made of $Al_XGa_{1-X}As$ semiconductor ($0 \leq X \leq 1$) or $Ga_XIn_{1-X}As_YP_{1-Y}$ semiconductor (about $0.5 \leq X \leq 1$, $0 \leq Y \leq 1$) lattice-matched to GaAs semiconductor, $(Al_XGa_{1-X})_YIn_{1-Y}P$ semiconductor and/or $Ga_XIn_{1-X}As_YP_{1-Y}$ semiconductor can be used to form a strained heterobarrier alleviating layer, for example.

In the surface emitting semiconductor device in accordance with the second embodiment, a semiconductor film of the first conductivity type is formed on a substrate. Semiconductor films constituting a light-emitting region are then formed on the semiconductor film of the first conductivity type, and thereafter a semiconductor film of the second conductivity type is formed on the light-emitting region. After forming the second conductivity type semiconductor film and the semiconductor films constituting the light-emitting region, these semiconductor films are etched selectively against the semiconductor film of the first conductivity type using a predetermined etchant. This etchant can etch the semiconductor films constituting the light-emitting region and the second conductivity type semiconductor film, but cannot etch the first conductivity type semiconductor region, thereby forming a semiconductor mesa.

In InP/GaInAsP long wavelength lasers, Br methanol is typically used in the etching step to form semiconductor mesas on semiconductor wafers. Since Br methanol has no etching selectivity against InP semiconductor of the lower cladding layer (first conductivity type semiconductor region), the lower cladding layer is also etched in the etching step. Due to volatility of Br methanol, its etching rate changes with time. Slight fluctuations in temperature, and concentration and mixing ratio of the etching solution cause the etching rate to vary for each etching step. Consequently, etchant having an etching rate within a predetermined range cannot be prepared for each etching step. In addition, in stirring the etching solution in which the wafer is soaked, the etching rate is varied depending on positions on the surface of the wafer due to the difference in its stirring speed between the outer and the center on the surface of the wafer. That is, in addition to the variation in the heights of the mesas on the same wafer, the etching rate is fluctuated depending on the number of use of the etching solution. With Br methanol, the amount of the side etching changes nonlinearly with the height of the mesas. Because of variations of the shapes of semiconductor mesas, it is not easy to control the shapes of active layers in semiconductor devices on the wafer. Accordingly, variations in the shapes of the active layers become large. These variations deteriorate the reproducibility and uniformity in laser characteristics.

However, an etching solution, such as phosphoric acid etchant, can be used to selectively etch semiconductor films for the SCH layer and the active layer against the lower cladding layer in the surface emitting semiconductor device according to the second embodiment constituted by the following: the cladding layer made of $(Al_XGa_{1-X})_YIn_{1-Y}P$ semiconductor ($0 \leq X \leq 1$) lattice-matched to GaAs semiconductor; the SCH semiconductor layer made of $Al_XGa_{1-X}As$ semiconductor ($0 \leq X \leq 1$) or $Ga_XIn_{1-X}As_YP_{1-Y}$ semiconductor (about $0.5 \leq X \leq 1$, $0 \leq Y \leq 1$) that is lattice-matched to GaAs semiconductor; and the active layer made of III-V semiconductor material including nitrogen (e.g., GaInNAs, GaNAs, GaNAsSb, GaNAsP, GaNAsSbP, GaInNAsSb, GaInNAsP, and GaInNAsSbP semiconductors), for example. Thus, the surface emitting semiconductor device having a buried heterostructure as in the second embodiment is formed. The semiconductor layer provided below the active layer or SCH layer functions as an etch stop layer in the surface emitting semiconductor device in accordance with the second embodiment. Therefore, the surface emitting semiconductor device in accordance with the second embodiment exhibits the favorable reproducibility and the favorable uniformity on the wafer in the heights of the mesas. Consequently, the reproducibility and the uniformity on the wafer in the width of the active layer are improved. The surface emitting semiconductor device may further include a heterobarrier alleviating layer made of $(Al_X Ga_{1-X})_Y In_{1-Y} P$ semiconductor ($0 \leq X \leq 1$), $Al_X Ga_{1-X} As$ semiconductor ($0 \leq X \leq 1$), and/or $Ga_X In_{1-X} As_Y P_{1-Y}$ semiconductor, in order to reduce its internal resistance.

As explained in the foregoing, the surface emitting semiconductor devices in accordance with the first and second embodiments can solve some technical problems which have not been overcome by InGaAsP/InP semiconductor optical devices. For example, the surface emitting semiconductor devices in accordance with the first and second embodiments can solve problems in terms of high temperature characteristics which occur in InGaAsP/InP semiconductor lasers. Hence, the surface emitting semiconductor devices in accordance with the first and second embodiments have advantageous temperature characteristics superior to InGaAsP/InP semiconductor optical devices.

As seen from the above description, since the surface emitting semiconductor devices according to the present embodiments have current confinement structures formed using photolithography, the positional accuracy, reproducibility, shape controllability and uniformity are improved as compared to the conventional surface emitting semiconductor devices. Stress in the manufacturing process is reduced in the surface emitting semiconductor devices, thereby improving the reliability. The large energy barrier height between the active layer and the current block region enables excellent current confinement. This barrier height is greater than energy barrier heights in InP/InGaAsP surface emitting semiconductor lasers. Therefore, the surface emitting semiconductor devices according to the embodiments exhibit excellent temperature characteristics.

Having described and illustrated the principle of the invention in a preferred embodiment thereof, it is appreciated by those having skill in the art that the invention can be modified in arrangement and detail without departing from such principles. For example, the surface emitting semiconductor device is not limited to the specific examples disclosed in the embodiments. Details in structures of these devices can be modified as necessary. We therefore claim all modifications and variations coming within the spirit and scope of the following claims.

What is claimed is:

1. A surface emitting semiconductor device comprising:
   a first conductivity type semiconductor region having a side surface, said first conductivity type semiconductor region being provided on a GaAs semiconductor region;
   an active layer having a side surface, said active layer being provided on said first conductivity type semiconductor region;
   a second conductivity type semiconductor layer, provided on said active layer, and having a side surface;
   a current block semiconductor region provided on said side surface of the first conductivity type semiconductor region, said side surface of said active layer, and said side surface of said second conductivity type semiconductor layer;
   a first DBR portion having a plurality of first DBR semiconductor layers and a plurality of second DBR semiconductor layers, said first DBR semiconductor layers and said second DBR semiconductor layers being arranged alternately;
   a second DBR portion having a plurality of third DBR semiconductor layers and a plurality of fourth DBR semiconductor layers, said third DBR semiconductor layers and said fourth DBR semiconductor layers being arranged alternately; and
   an additional semiconductor layer made of III-V compound semiconductor;
   wherein said first conductivity type semiconductor region, said active layer and said second conductivity type semiconductor layer are provided between said first DBR portion and said second DBR portion;
   wherein said current block semiconductor region is provided for confining carriers to said first conductivity type semiconductor region, said active layer, and said second conductivity type semiconductor layer;
   wherein said active layer is made of III-V compound semiconductor including at least a nitrogen element as a V group member;
   wherein said additional semiconductor layer is provided between said active layer and said first conductivity type semiconductor region; and
   wherein a photoluminescence wavelength of said III-V compound semiconductor of said additional semiconductor layer is between that of said active layer and that of said first conductivity type semiconductor region.

2. The surface emitting semiconductor device according to claim 1, wherein III-V compound semiconductor of said active layer contains at least gallium (Ga) as a III group member; and
   wherein said III-V compound semiconductor of said active layer further contains arsenic (As) as a V group member.

3. The surface emitting semiconductor device according to claim 1,
   wherein said active layer is made of at least one of GaInNAs semiconductor; GaNAs semiconductor, GaNAsSb semiconductor, GaNAsP semiconductor, GaNAsSbP semiconductor, GaInNAsSb semiconductor, GaInNAsP semiconductor and GaInNAsSbP semiconductor.

4. The surface emitting semiconductor device according to claim 1,
   wherein a refractive index of said second conductivity type semiconductor layer is higher than that of said current block semiconductor region.

5. A surface emitting semiconductor device comprising:
   a first conductivity type semiconductor region having a side surface, said first conductivity type semiconductor region being provided on a GaAs semiconductor region;
   an active layer having a side surface, said active layer being provided on said first conductivity type semiconductor region;
   a second conductivity type semiconductor layer, provided on said active layer, and having a side surface;
   a current block semiconductor region provided on said side surface of the first conductivity type semiconductor region, said side surface of said active layer, and said side surface of second conductivity type semiconductor layer;
a first DBR portion having a plurality of first DBR semiconductor layers and a plurality of second DBR semiconductor layers, said first DBR semiconductor layers and said second DBR semiconductor layers being arranged alternately;
a second DBR portion having a plurality of third DBR semiconductor layers and a plurality of fourth DBR semiconductor layers, said third DBR semiconductor layers and said fourth DBR semiconductor layers being arranged alternately; and
an additional semiconductor layer made of III-v compound semiconductor;
wherein said first conductivity type semiconductor region, said active layer and said second conductivity type semiconductor layer are provided between said first DBR portion and said second DBR portion;
wherein said current block semiconductor region is provided for confining carriers to said first conductivity type semiconductor region, said active layer, and said second conductivity type semiconductor layer;
wherein said active layer is made of III-v compound semiconductor including at least one nitrogen element as a V group member;
wherein said additional semiconductor layer is provided between said active layer and said second conductivity type semiconductor layer; and
wherein a photoluminescence wavelength of said III-V compound semiconductor of said additional semiconductor layer is between that of said active layer and that of said second conductivity type semiconductor layer.

6. A surface emitting semiconductor device comprising:
a first conductivity type semiconductor region having a side surface, said first conductivity type semiconductor region being provided on a GaAs semiconductor region;
an active layer having a side surface, said active layer being provided on said first conductivity type semiconductor region;
a second conductivity type semiconductor layer, provided on said active layer, and having a side surface;
a current block semiconductor region provided on said side surface of the first conductivity type semiconductor region, said side surface of said active layer, and said side surface of said second conductivity type semiconductor layer;
a first DBR portion having a plurality of first DBR semiconductor layers and a plurality of second DBR semiconductor layers, said first DBR semiconductor layers and said second DBR semiconductor layers being arranged alternately;
a second DBR portion having a plurality of third DBR semiconductor layers and a plurality of fourth DBR semiconductor layers, said third DBR semiconductor layers and said fourth DBR semiconductor layers being arranged alternately;
a first SCH layer provided between said first conductivity type semiconductor region and said active layer; and
a second SCH layer provided between said active layer and said second conductivity type semiconductor layer;
wherein said first conductivity type semiconductor region, said active layer and said second conductivity type semiconductor layer are provided between said first DBR portion and said second DBR portion;
wherein said current block semiconductor region is provided for confining carriers to said first conductivity type semiconductor region, said active layer, and said second conductivity type semiconductor layer; and
wherein said active layer is made of III-V compound semiconductor including at least one nitrogen element as a V group member.

7. The surface emitting semiconductor device according to claim 6, further comprising an additional semiconductor layer made of III-V compound semiconductor;
wherein said additional semiconductor layer is provided between said first SCH layer and said first conductivity type semiconductor region; and
wherein a photoluminescence wavelength of said III-V compound semiconductor of said additional semiconductor layer is between that of said first SCH layer and that of said first conductivity type semiconductor layer.

8. The surface emitting semiconductor device according to claim 6, further comprising an additional semiconductor layer made of III-V compound semiconductor;
wherein said additional semiconductor layer is provided between said second SCH layer and said second conductivity type semiconductor layer;
wherein a photoluminescence wavelength of said III-V compound semiconductor of said additional semiconductor layer is between that of said second SCH layer and that of said second conductivity type semiconductor layer.

9. The surface emitting semiconductor device according to claim 1,
wherein said current block semiconductor region includes first and second current block layers;
wherein said first conductivity type semiconductor region is made of $(Al_{X1}Ga_{1-X1})_{Y1}In_{1-Y1}P$ semiconductor, where a composition X1 has a value in a range of zero or greater but not greater than 1;
wherein said second conductivity type semiconductor layer is made of $(Al_{X2}Ga_{1-X2})_{Y2}In_{1-Y2}P$ semiconductor, where a composition X2 has a value in a range of zero or greater but not greater than 1; and
wherein said first and second current block layers are made of $(Al_{X3}Ga_{1-X3})_{Y3}In_{1-Y3}P$ semiconductor, where a composition X3 has a value in a range of zero or greater but not greater than 1.

10. The surface emitting semiconductor device according to claim 1,
wherein said current block semiconductor region includes first and second current block layers;
wherein said first conductivity type semiconductor region is made of an $Al_{X1}Ga_{1-X1}As$ semiconductor, where a composition X1 has a value in a range of zero or greater but not greater than 1;
wherein said second conductivity type semiconductor layer is made of an $Al_{X2}Ga_{1-X2}As$ semiconductor, where a composition X2 has a value in a range of zero or greater but not greater than 1; and
wherein said first and second current block layers are made of $Al_{X3}Ga_{1-X3}As$ semiconductor, where a composition X3 has a value in a range of zero or greater but not greater than 1.

11. The surface emitting semiconductor device according to claim 6,
wherein said first SCH layer is made of one of $Al_{X1}Ga_{1-X1}As$ semiconductor ($0 \leq X1 \leq 1$) and $Ga_{X2}In_{1-X2}As_{Y2}P_{1-Y2}$ semiconductor (about $0.5 \leq X2 \leq 1$, $0 \leq Y2 \leq 1$) lattice-matched to GaAs semiconductor; and wherein said second SCH layer is made of one of $Al_{X3}Ga_{1-X3}As$ semiconductor ($0 \leq X3 \leq 1$) and $Ga_{X4}In_{1-X4}As_{Y4}P_{1-Y4}$ semiconductor (about $0.5 \leq X4 \leq 1$, $0 \leq Y4 \leq 1$) lattice-matched to GaAs semiconductor.

12. A surface emitting semiconductor device comprising:
a first conductivity type semiconductor region having a side surface, said first conductivity type semiconductor region being provided on a GaAs semiconductor region;
an active layer having a side surface, said active layer being provided on said first conductivity type semiconductor region;
a second conductivity type semiconductor layer, provided on said active layer, and having a side surface;
a current block semiconductor region provided on said side surface of the first conductivity type semiconductor region, said side surface of said active layer, and said side surface of second conductivity type semiconductor layer;
a first DBR portion having a plurality of first DBR semiconductor layers and a plurality of second DBR semiconductor layers, said first DBR semiconductor layers and said second DBR semiconductor layers being arranged alternately; and
a second DBR portion having a plurality of third DBR semiconductor layers and a plurality of fourth DBR semiconductor layers, said third DBR semiconductor layers and said fourth DBR semiconductor layers being arranged alternately;
wherein said first conductivity type semiconductor region, said active layer and said second conductivity type semiconductor layer are provided between said first DBR portion and said second DBR portion;
wherein said current block semiconductor region is provided for confining carriers to said first conductivity type semiconductor region, said active layer, and said second conductivity type semiconductor layer;
wherein said active layer is made of III-V compound semiconductor including at least one nitrogen element as a V group member;
wherein said current block semiconductor region includes first and second current block layers; and
wherein said first and second current block semiconductor layers are made of material not containing aluminum as a III group element.

13. A surface emitting semiconductor device comprising:
a first conductivity type semiconductor region having a side surface, said first conductivity type semiconductor region being provided on a GaAs semiconductor region;
an active layer having a side surface, said active layer being provided on said first conductivity type semiconductor region;
a second conductivity type semiconductor layer, provided on said active layer, and having a side surface;
a current block semiconductor region provided on said side surface of the first conductivity type semiconductor region, said side surface of said active layer, and said side surface of said second conductivity type semiconductor layer;
a first DBR portion having a plurality of first DBR semiconductor layers and a plurality of second DBR semiconductor layers, said first DBR semiconductor layers and said second DBR semiconductor layers being arranged alternately; and
a second DBR portion having a plurality of third DBR semiconductor layers and a plurality of fourth DBR semiconductor layers, said third DBR semiconductor layers and said fourth DBR semiconductor layers being arranged alternately;
wherein said first conductivity type semiconductor region, said active layer and said second conductivity type semiconductor layer are provided between said first DBR portion and said second DBR portion;
wherein said current block semiconductor region is provided for confining carriers to said first conductivity type semiconductor region, said active layer, and said second conductivity type semiconductor layer;
wherein said active layer is made of III-V compound semiconductor including at least one nitrogen element as a V group member;
wherein said current block semiconductor region comprises first and second current block layers;
wherein said first and second current block semiconductor layers are made of material not containing aluminum as a III group element;
wherein said first conductivity type semiconductor region is made of material not containing aluminum as a III group element; and
wherein said second conductivity type semiconductor layer is made of material not containing aluminum as a III group element.

14. The surface emitting semiconductor device according to claim 1,
wherein said GaAs semiconductor region is provided by one of a GaAs semiconductor layer and a gallium arsenide substrate.

15. The surface emitting semiconductor device according to claim 1,
wherein said surface emitting semiconductor device is constituted to provide at least one of a semiconductor laser diode and a semiconductor optical amplifier.

16. A surface emitting semiconductor device comprising:
a first conductivity type semiconductor region having a side surface, said first conductivity type semiconductor region being provided on a GaAs semiconductor region;
an active layer having a side surface, said active layer being provided on said first conductivity type semiconductor region;
a second conductivity type semiconductor layer, provided on said active layer, and having a side surface;
a current block semiconductor region provided on said side surface of the first conductivity type semiconductor region, said side surface of said active layer, and said side surface of said second conductivity type semiconductor layer;
a first DBR portion having a plurality of first DBR semiconductor layers and a plurality of second DBR semiconductor layers, said first DBR semiconductor layers and said second DBR semiconductor layers being arranged alternately; and
a second DBR portion having a plurality of third DBR semiconductor layers and a plurality of fourth DBR semiconductor layers, said third DBR semiconductor layers and said fourth DBR semiconductor layers being arranged alternately;
wherein said first conductivity type semiconductor region, said active layer and said second conductivity type semiconductor layer are provided between said first DBR portion and said second DBR portion;
wherein said current block semiconductor region is provided for confining carriers to said first conductivity type semiconductor region, said active layer, and said second conductivity type semiconductor layer;

wherein said active layer is made of III-V compound semiconductor including at least one nitrogen element as a V group member; and wherein said GaAs semiconductor region is provided between said first DBR portion and said active layer.

17. A surface emitting semiconductor device comprising:

a first conductivity type semiconductor region having a side surface, said first conductivity type semiconductor region being provided on a GaAs semiconductor region;

an active layer having a side surface, said active layer being provided on said first conductivity type semiconductor region;

a second conductivity type semiconductor layer, provided on said active layer, and having a side surface;

a current block semiconductor region provided on said side surface of the first conductivity type semiconductor region, said side surface of said active layer, and said side surface of said second conductivity type semiconductor layer;

a first DBR portion having a plurality of first DBR semiconductor layers and a plurality of second DBR semiconductor layers, said first DBR semiconductor layers and said second DBR semiconductor layers being arranged alternately; and a second DBR portion having a plurality of third DBR semiconductor layers and a plurality of fourth DBR semiconductor layers, said third DBR semiconductor layers and said fourth DBR semiconductor layers being arranged alternately;

wherein said first conductivity type semiconductor region, said active layer and said second conductivity type semiconductor layer are provided between said first DBR portion and said second DBR portion;

wherein said current block semiconductor region is provided for confining carriers to said first conductivity type semiconductor region, said active layer, and said second conductivity type semiconductor layer;

wherein said active layer is made of III-V compound semiconductor including at least one nitrogen element as a V group member; and wherein said second DBR portion is provided between said first DBR portion and said GaAs semiconductor region.

* * * * *